United States Patent
Ohnishi et al.

(10) Patent No.: US 7,589,588 B2
(45) Date of Patent: Sep. 15, 2009

(54) HIGH-FREQUENCY POWER AMPLIFIER AND RADIO COMMUNICATION EQUIPMENT USING THE SAME

(75) Inventors: Masami Ohnishi, Hachioji (JP); Tomonori Tanoue, Machida (JP); Hidetoshi Matsumoto, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 101 days.

(21) Appl. No.: 11/439,990

(22) Filed: May 25, 2006

(65) Prior Publication Data

US 2006/0267684 A1 Nov. 30, 2006

(30) Foreign Application Priority Data

May 26, 2005 (JP) .............................. 2005-153735

(51) Int. Cl.
*H03F 1/14* (2006.01)
(52) U.S. Cl. ...................................................... 330/51
(58) Field of Classification Search .................. 330/51, 330/295, 124 R
See application file for complete search history.

(56) References Cited

U.S. PATENT DOCUMENTS

| | | | | |
|---|---|---|---|---|
| 5,256,987 A | * | 10/1993 | Kibayashi et al. | ........... 330/295 |
| 5,548,246 A | * | 8/1996 | Yamamoto et al. | ............ 330/51 |
| 5,903,854 A | * | 5/1999 | Abe et al. | ................ 455/575.1 |
| 5,905,409 A | * | 5/1999 | Fujimoto et al. | ............ 330/302 |
| 6,163,221 A | * | 12/2000 | Matsuno | ..................... 330/302 |
| 6,943,624 B2 | | 9/2005 | Ohnishi et al. | |
| 7,154,336 B2 | * | 12/2006 | Maeda | ........................ 330/285 |
| 2003/0153293 A1 | * | 8/2003 | Richter et al. | ............... 455/302 |
| 2005/0024136 A1 | * | 2/2005 | Yamaguchi | ............. 330/124 R |
| 2006/0061417 A1 | | 3/2006 | Ohnishi et al. | |

FOREIGN PATENT DOCUMENTS

| | | |
|---|---|---|
| JP | 07-336168 | 6/1994 |
| JP | 2003-046340 | 7/2001 |
| JP | 2004-134823 | 10/2002 |

* cited by examiner

*Primary Examiner*—Robert Pascal
*Assistant Examiner*—Khiem D Nguyen
(74) *Attorney, Agent, or Firm*—Stites & Harbison, PLLC; Juan Carlos A. Marquez, Esq.

(57) ABSTRACT

A high-frequency power amplifier comprising: a plurality of power amplifiers arranged in parallel; an inductance element inserted in series in an input signal line of said each power amplifier; an input matching circuit for performing matching of inputs of a parallel connection which connected each series connection of said power amplifier and said inductance element in parallel; an output matching circuit for performing matching of outputs of the parallel connection; and a control unit for controlling said power amplifiers in such a manner that one of said power amplifiers is always brought to an operation condition and the remainder of said power amplifiers are brought to an operation or non-operation condition.

20 Claims, 18 Drawing Sheets (a)

(b)

FIG.6B  *Prior Art*
(a)
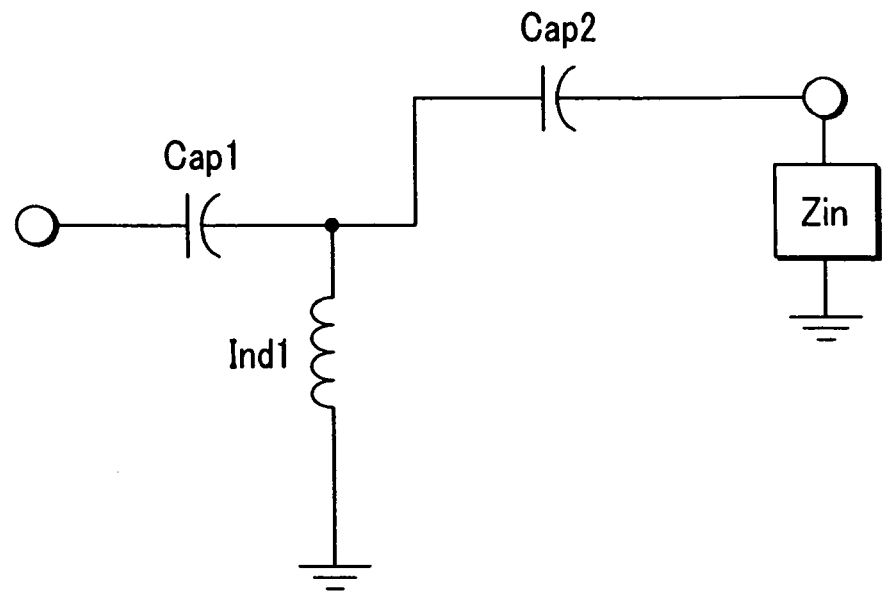
(b)
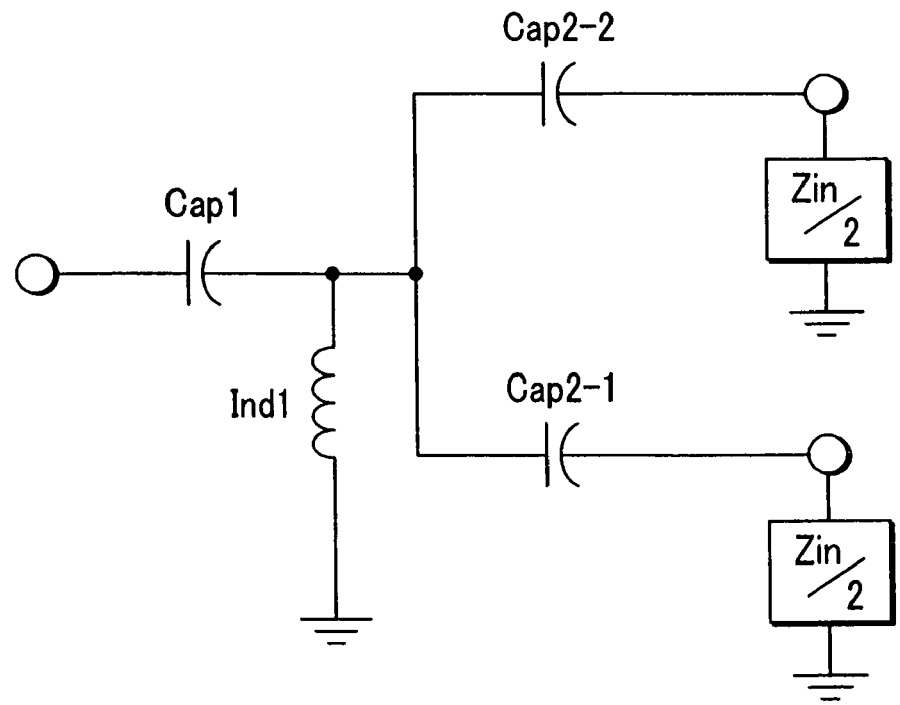

(M≠N)

HIGH-FREQUENCY POWER AMPLIFIER AND RADIO COMMUNICATION EQUIPMENT USING THE SAME

CLAIM OF PRIORITY

The present application claims priority from Japanese Application JP 2005-153735 filed on May 26, 2005, the content of which is hereby incorporated by reference into this application.

FIELD OF THE INVENTION

This invention relates to a high-frequency power amplifier which is to be used in a transmission unit of radio communication equipment such as a mobile phone or the like and, more particularly, to a high-frequency power amplifier module which can switch between a large-output amplifier and a small-output amplifier by a bias control.

BACKGROUND OF THE INVENTION

As a structure suitable for facilitating a highly efficient operation of a high-frequency power amplifier, a system in which a plurality of output stage amplifiers are prepared and the respective output stage amplifiers are used so as to be switched by a switch according to an output level is disclosed in Japanese Patent Laid-Open No. H07-336168. That is, there is disclosed a power amplifier in which a first amplifying circuit for performing amplification of a high power level by a highly efficient operation, and a second amplifying circuit for performing amplification output of a low power level by a highly efficient operation are connected in parallel, and an FET switch is inserted in the output side of the second amplifying circuit.

On the other hand, as a way to improve efficiency, a structure in which an amplifier is used so as to be switched without a switch for an output stage amplifier is proposed in Japanese Patent Laid-Open No. 2003-046340, Japanese Patent Laid-Open No. 2004-134823 or in "School of Engineering Information and Communications University (ICU), A power Efficient W-CDMA Smart Power Amplifier With Emitter Area Adjusted For Output Power Levels, 2004 IEEE2004 IEEE MTT-S Digest".

First of all, Japanese Patent Laid-Open No. 2003-046340 discloses a high-frequency power amplifier in which an impedance matching circuit is connected to the output sides of two power amplifying units of different saturation output and the power amplifying units are used so as to be switched at the time of high output and at the time of low output. Also, in FIGS. 9 and 10 of Japanese Patent Laid-Open No. 2003-046340, there is shown a high-frequency power amplifier in which two power amplifying units are each connected to an input matching circuit which is composed of an inductor.

Also, Japanese Patent Laid-Open No. 2004-134823 discloses a high-frequency power amplifier in which a plurality of bipolar transistors of different emitter sizes are used in the amplifier, a bias supplying means for separately controlling supply of a bias to the respective transistors is provided, and ON-OFF control is carried out depending upon the magnitude of output power.

Moreover, the above document "School of Engineering Information and Communications University (ICU)" discloses a high-frequency amplifier in which the operation of a part of amplifiers is stopped by controlling a bias supply to a semiconductor element forming a plurality of the amplifiers, whereby efficiency at the time of low output is improved.

SUMMARY OF THE INVENTION

Recently, in a mobile communication field, miniaturization and reduction in weight are required in a base station as well as a portable terminal. In connection with this, high efficiency of a power amplifier unit which considerably affects the miniaturization and reduction in weight has become critical. Particularly, in a portable terminal device, a battery is generally used a power source and continuous operable time of the portable terminal device has a limitation. Therefore, in order that the portable terminal device can be operated for a long time, it is essential to reduce the power (high efficiency) consumed in a power amplifier unit which most consumes power in a circuit. Also, in a base station, the high-frequency power amplifier unit is set in the vicinity of an antenna for the purpose of reduction of cable losses, so that miniaturization and lightening of the high-frequency power amplifier unit are required and high efficiency of the high-frequency power amplifier unit is indispensable.

Generally, in a high-frequency power amplifier using a semiconductor element, the higher the output level, the better the efficiency. The efficiency is highest near saturation output. Also, a level of maximum output (saturation output) capable of being taken out depends upon a size of the semiconductor element to be used. Therefore, in order to improve efficiency at the time of low output, when the semiconductor element to be used is small-sized and an amplifier in which saturation level is low is produced, it is impossible to obtain output required at the time of high output. Also, when the amplifier is designed so as to provide high efficiency at the time of high output, its efficiency is considerably lowered at the time of low output. Thus, in a single amplifier, it is considerably hard to realize the high efficiency at the time of high output and at the time of low output.

For example, in the above-mentioned conventional system which is disclosed in Japanese Patent Laid-Open No. H07-336168 and in which an output stage amplifiers are used so as to be switched by a switch, gain difference between the amplifiers connected in parallel can be optionally determined by suitably designing the amplifiers, so that it is possible to minimize the gain difference. However, since the switch is employed, the efficiency is lowered.

On the other hand, in the system disclosed in Japanese Patent Laid-Open No. 2003-046340 and Japanese Patent Laid-Open No. 2004-134823 in which output stage amplifiers are switched without the use of a switch, lowering of the efficiency due to losses caused by a switch is not brought about, but large and small amplifiers are always connected in a high-frequency relation, and matching conditions both at the time of operation of an amplifier at a large output side of the large and small amplifiers and at the time of non-operation of an amplifier at a small output side of the large and small amplifiers, and both at the time of non-operation of the amplifier at the large output side and at the time of operation of the amplifier at the small output side, have to be satisfied, and there is a problem that it is hard to realize a circuit construction which allows gain difference among the amplifiers to be minimized.

Also, in the system described in the document "School of Engineering Information and Communications University (ICU)" in which the operation of a part of amplifiers is stopped at the time of small output, it is conceivable that the problem caused by the large and small amplifiers being always connected in the high-frequency relationship is overcome. However, in the system disclosed in the document "School of Engineering Information and Communications University (ICU)", an input line section of each amplifier which includes an input matching circuit is formed as a low order matching circuit which is constructed by lumped constant (C) only. Therefore, matching is limited to a restricted region only, and gain difference at the time of changing large output operation and small output operation is increased.

One of objects of the present invention is to provide a high-frequency amplifier and radio communication equipment using the same in which gain difference between the time of large output operation and the time of small output operation is minimized in the high-frequency amplifier of type in which the amplifier is adapted to be switched.

The following is an example of a representative means of the present invention. There is provided a high-frequency power amplifier comprising: a plurality of power amplifiers arranged in parallel; an inductance element inserted in series in an input signal line of said each power amplifier; an input matching circuit for performing matching of inputs of a parallel connection which connected each series connection of said power amplifier and said inductance element in parallel; an output matching circuit for performing matching of outputs of the parallel connection; and a control unit for controlling said power amplifiers in such a manner that one of said power amplifiers is always brought to an operation condition and the remainder of said power amplifiers are brought to an operation or non-operation condition.

According to the present invention, it is possible to obtain the effect of minimizing gain difference between the time of large output operation and the time of small output operation, by causing the inductance elements to be inserted in series in the signal input units of the respective amplifiers in the high-frequency power amplifier in which the amplifiers are all operated at the time of large output operation and a part of the amplifiers is stopped at the time of small output operation.

BRIEF DESCRIPTION OF THE DRAWINGS

These and other objects and many of the attendant advantages of the present invention will be readily appreciated as the same becomes better understood by reference to the following detailed description when considered in connection with the accompanying drawings, wherein:

FIG. 6B is a circuit diagram showing an equalizing circuit of a conventional example;

DETAILED DESCRIPTION OF THE PREFERRED EMBODIMENTS

Figure 1:
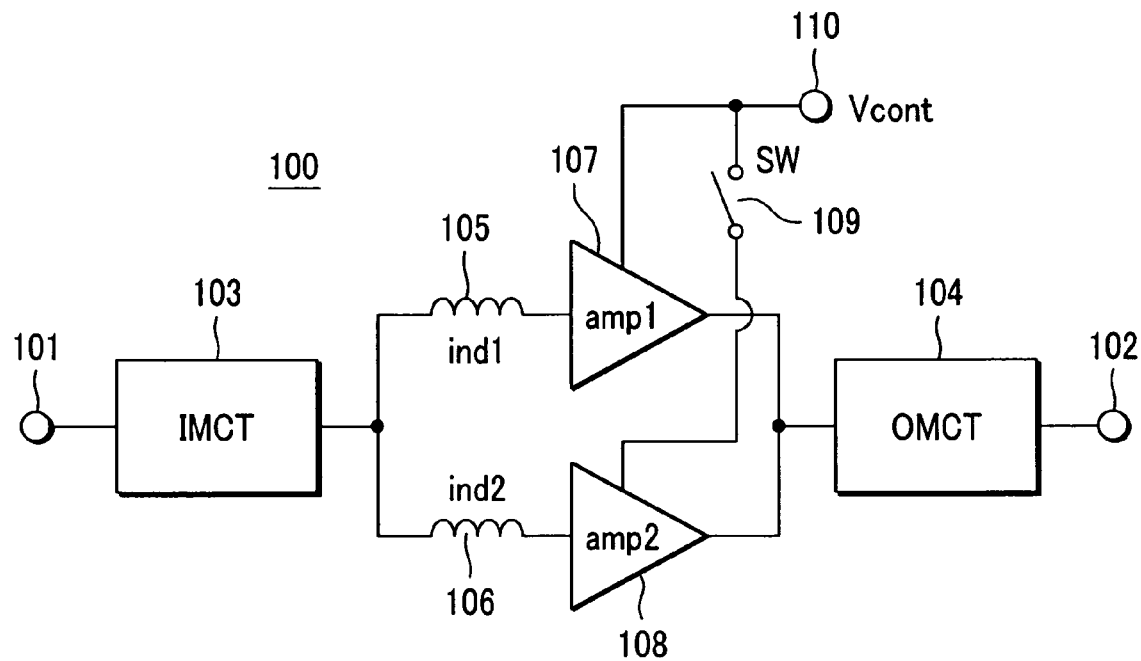
FIG. 1 is a block diagram showing an embodiment of a high-frequency power amplifier according to the present invention.

Now, preferred embodiments of a high-frequency power amplifier according to the present invention will be discussed in detail hereinafter with reference to the accompanying drawings. FIG. 1 illustrates a high-frequency power amplifying module (a high-frequency power amplifier) 100 according to an embodiment of the present invention. The high-frequency power amplifying module 100 of an amplifier switching type comprises a high-frequency input terminal 101, an input matching circuit 103, an amplifying unit, an output matching circuit 104 and an output terminal 102. These are integrated to one chip. The amplifying unit comprises a first input inductance 105 for adjusting gain, a first amplifier 107 connected to the first input inductance 105, a second input inductance 106 for adjusting gain, and a second amplifier 108 connected to the second input inductance 106. The first amplifier 107 is connected directly to a control signal terminal 110, and the second amplifier 108 is connected through a switch 109 of a control unit to the control signal terminal 110. The control signal terminal 110 is connected to a bias control unit (not shown) for controlling bias or the like of each amplifier according to a control signal. The switch 109 carries out ON-OFF operation according to a control signal (output switching control signal) different from the control signal supplied from the control signal terminal 110, and switches the high-frequency power amplifier 100 to two conditions including the time of large output operation and the time of small output operation. The output switching control signal is supplied from an output control circuit (not shown).

Incidentally, the high-frequency power amplifier, the control unit, the bias control unit, and the output control unit serve as a high-frequency power amplifying unit for radio communication equipment as a whole. Therefore, there is no intention excluding a structure in which the respective terminals shown in FIG. 1 are disposed on positions of a continuous line on the actual equipment. Also, the bias control unit and the output control circuit generate signals relating to an output control function of the high-frequency power amplifier and supply, together with the switch 109. They are merely referred to as "control unit", unless otherwise indicated.

Also, the bias control unit and the output control unit may be provided in the high-frequency power amplifying module 100 in the radio communication equipment or may be constructed as a part of a baseband control unit provided outside the high-frequency power amplifying module.

High-frequency power is inputted from the high-frequency input terminal 101 of the high-frequency power amplifying module 100, passes through the input matching circuit 103, is amplified in the amplifying unit, thereafter passes through the output matching circuit 104, and is outputted from the output terminal 102. At this time, the operation of the amplifying unit is changed by two conditions, at the time of the large output operation and at the time of the small output operation. At the time of the large output operation, a signal which passes through the input matching circuit 103 is multipled, passes through the first input inductance 105 and the second input inductance 106, is amplified by both the first amplifier 107 and the second amplifier 108, thereafter is synthesized, passes through the output matching circuit 104, and is outputted from the output terminal 102.

Also, at the time of the small output operation, an input signal passes through the first input inductance 105, is amplified in the first amplifier 107, passes through the output matching circuit 104, and is outputted from the output terminal 102.

By the switching of the amplifier at the time of the large output operation and at the time of the small output operation, high efficiency in respective modes can be realized. The control of the amplifying unit at this time is carried out by the switch 109 which is operated according to the output switching control signal from the output control unit. That is, at the time of the large output operation, the switch 109 is turned on, whereby both the first amplifier 107 and the second amplifier 108 are brought to operation conditions. Also, at the time of the small output operation, the switch 109 is turned off, whereby the second amplifier 108 is brought to a non-operation condition.

According to the illustrated embodiment, in the high-frequency power amplifier in which all amplifiers are adapted to be operated at the time of the large output operation, and a part of the amplifiers is adapted to be stopped at the time of the small output operation, the effect of decrease in gain difference between at the time of the large output operation and at the time of the small output operation can be given by causing the inductances for adjusting gain to be inserted in series between the signal input units and the input matching circuits of the respective amplifiers.

Incidentally, the control unit which switches the above-mentioned other power amplifier to the operation condition or the non-operation condition according to the above-mentioned control signal is not limited to the above-mentioned construction. For example, a switch which interlocks the switch 109 operating according to the output switching control signal of the output control unit and is opened and closed may be additionally disposed between the input terminal of the second amplifier 108 and the second input inductance 106 or between the second input inductance 106 and the input matching circuit 103.

Figure 2:
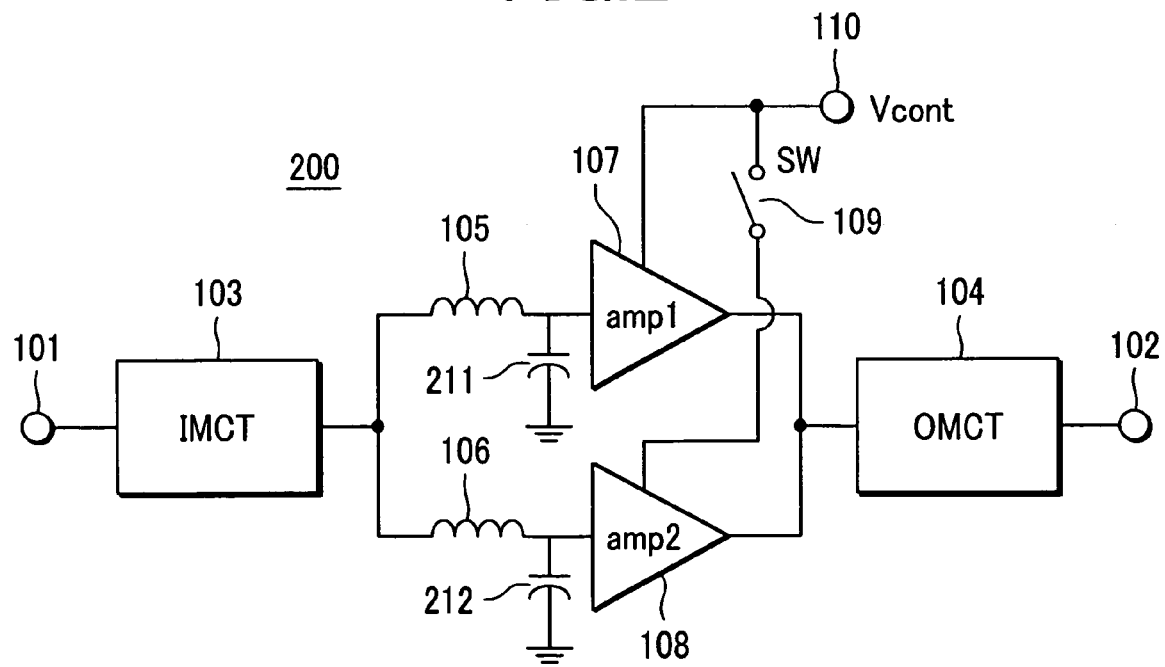
FIG. 2 is a block diagram showing another embodiment of the high-frequency power amplifier of the present invention.

Referring to FIG. 2, there is illustrated a high-frequency power amplifying module (high-frequency power amplifier) according to still another embodiment of the present invention. The high-frequency power amplifier 200 includes shunt capacitors 211, 212 which are additionally inserted between a line between the first input inductance 105 for adjusting gain and the first amplifier 107, and an earth, and between a line between the second input inductance 106 and the second amplifier 108, and an earth, respectively in the structure of FIG. 1.

By the insertion of the first shunt capacitor 211 and the second shunt capacitor 212, it is possible to considerably reduce the gain difference even if the first amplifier 107 and the second amplifier 108 are different from each other in the output power thereof. Incidentally, the values of the first shunt capacitor 211 and the second shunt capacitor 212 may not be necessarily the same. Other structures, operations and effects of this embodiment are similar to those of the embodiment shown in FIG. 1.

Figure 3:
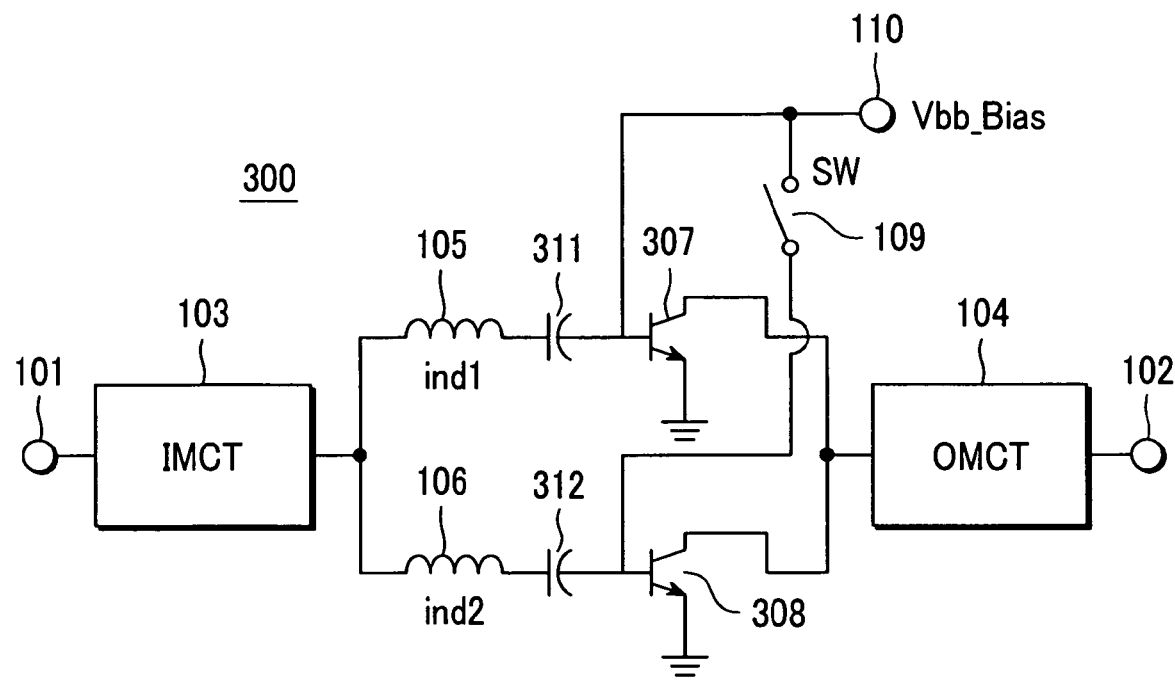
FIG. 3 is a block diagram showing still another embodiment of the high-frequency power amplifier of the present invention.

Referring to FIG. 3, there is illustrated a high-frequency power amplifying module according to yet another embodiment of the present invention. In the high-frequency power amplifying module 300, a part which corresponds to the first amplifier 107 and the second amplifier 108 of the embodiment shown in FIG. 1 is constructed by one stage bipolar transistors 307, 308. Also, base bias of the bipolar transistors 307, 308 is cut by the capacitances 311, 312.

The switching at the time of the large output operation and at the time of the small output operation in the high-frequency power amplifying module according to this embodiment is carried out as follows. That is, at the time of the large output operation, the switch 109 is turned on, whereby the bipolar transistors 307, 308 are operated, and at the time of the small output operation, though the bipolar transistor 307 is operated, the operating switch 109 is turned off, so that the base bias is not applied and the bipolar transistor 308 is brought to a non-operation condition. Other construction, operation and effect of this embodiment are similar to those of the embodiment shown in FIG. 1.

Figure 4:
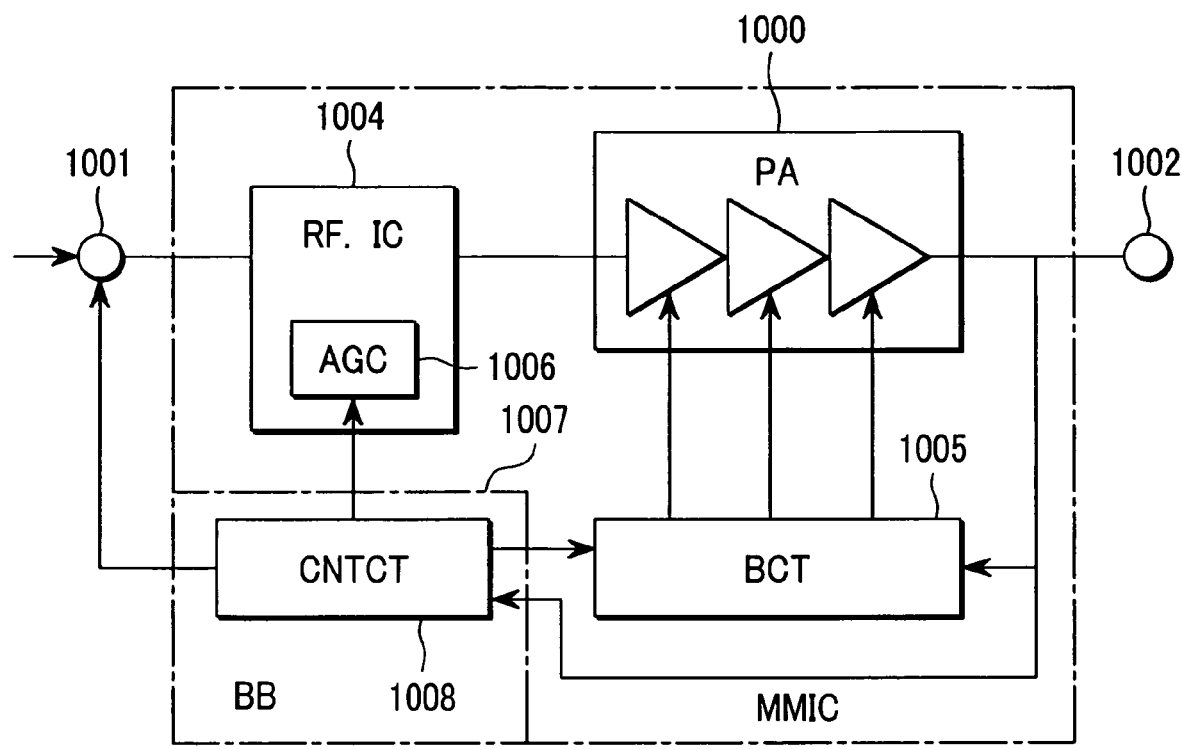
FIG. 4 is a block diagram showing an example of a transmission unit of radio telecommunication equipment using the high-frequency power amplifier of the present invention.

Referring to FIG. 4, there is illustrated a typical example of cases in which the high-frequency power amplifying modules (high-frequency power amplifiers) according to the present invention are used in transmission units of radio communication equipments of various types.

The transmission unit of the radio communication equipment comprises a high-frequency power amplifying module 1000 which is constructed, for example, in such a manner as the high-frequency power amplifying module of FIG. 3 is done, a high-frequency IC 1004 having a gain variable (AGC) amplifier 1006, and a bias control unit 1005. In the high-frequency power amplifying module 1000, a high-frequency power amplifying circuit for amplifying a high-frequency signal, an A/D transducer, a bias control circuit and the like are mounted on a single ceramic substrate as MMIC (Microwave Monolithic IC). A part of a baseband control circuit 1007 having an output control unit 1008 also constitutes the transmission unit. A high-frequency output terminal 1002 of the high-frequency power amplifying module 1000 is connected to an antenna (not shown).

In the baseband control circuit 1007, a modulation and demodulation circuit which can modulate and demodulate a W-CDMA signal, a baseband circuit for generating I, Q signals according to transmission date (baseband signal) and processing the I, Q signals extracted from reception signals, a band pass filter (BPF1) for eliminating harmonic components from transmission signals, a band pass filter (BPF2) for eliminating unnecessary waves from the reception signals, and the like are mounted and unified into a single package. Moreover, a transmission variable gain amplifier (GCA) for amplifying a transmission signal after modification thereof, a mixer (Tx-MIX) for up-converting the amplified transmission signal, a low noise amplifier (LNA) for amplifying a reception signal, a mixer (Rx-MIX) for down-converting the amplified reception signal, and the like are formed on a single semiconductor chip.

Moreover, the radio communication equipment is also provided with a front end module. This front end module is provided with a changeover switch for switching transmission and reception, an output detection circuit for detecting an output level of the transmission signal outputted from the high-frequency power amplifying module, a filter for eliminating noises such as harmonics included in the transmission signal, an automatic power control circuit for producing a control signal to the gain variable (AGC) amplifier according to the output detection signal from the detection circuit and the power control signal from the baseband circuit, and the like.

In the baseband control circuit 1007, the transmission signal (input signal) of a high-frequency, the phase modulation of which is carried out according to information for transmitting a carrier wave, is produced. This input signal passes through a high-frequency input terminal 1001, passes through the high-frequency IC 1004 for carrying out a gain control or the like, and reaches the high-frequency power amplifying module 1000. That is, the input signal is inputted to the gain variable (AGC) amplifier 1006 in which power amplifying is carried out, thereafter amplification is carried out in the high-frequency power amplifying module 1000, and an antenna is operated by an output signal outputted from the high-frequency output terminal 1002 and carries out transmission.

A part of the output power from the high-frequency amplifier unit 1000 is detected and fed back to the bias control unit 1005, whereby the control of the output power or the like is carried out. The detected output power value is fed back to not only the bias control unit 1005 but also the high-frequency IC 1004, the AGC amplifier included in the high-frequency IC 1004 is then controlled, and the output power or the like is controlled.

The application of the present invention to the high-frequency amplifier unit 1000 can reduce an amplification-variable range, so that the AGC amplifier can be compactly constructed.

For example, when the high-frequency power amplifying module of the present invention constructed by the first amplifier which is always operated and the second amplifier which is operated only at the time of high output is used in a transmission unit of radio telecommunication equipment of a W-CDMA type, it is possible to reduce a size (an area) regarding a section of the amplifier which is always operated and a section of the high-frequency IC which corresponds to the section of the amplifier. Therefore, effect is given of miniaturization of an entire of the transmission unit.

As an example, it is possible to decrease the size of the MMIC chip to ½ according to the present invention, when compared to a method in which a plurality of output stage amplifiers conventionally constructed so as to be suitable to carry out a highly efficient operation both at the time of high output and at the time of low output are prepared and the respective output stage amplifiers are used so as to be switched by a switch according to an output level.

Now, the principal effect which are given by the respective embodiments of the present invention, namely, the effect of minimizing a gain difference between at the time of high output and at the time of low output in the high-frequency power amplifier which is switched to high-output operation and low-output operation, will be discussed hereinafter.

Figure 5A:
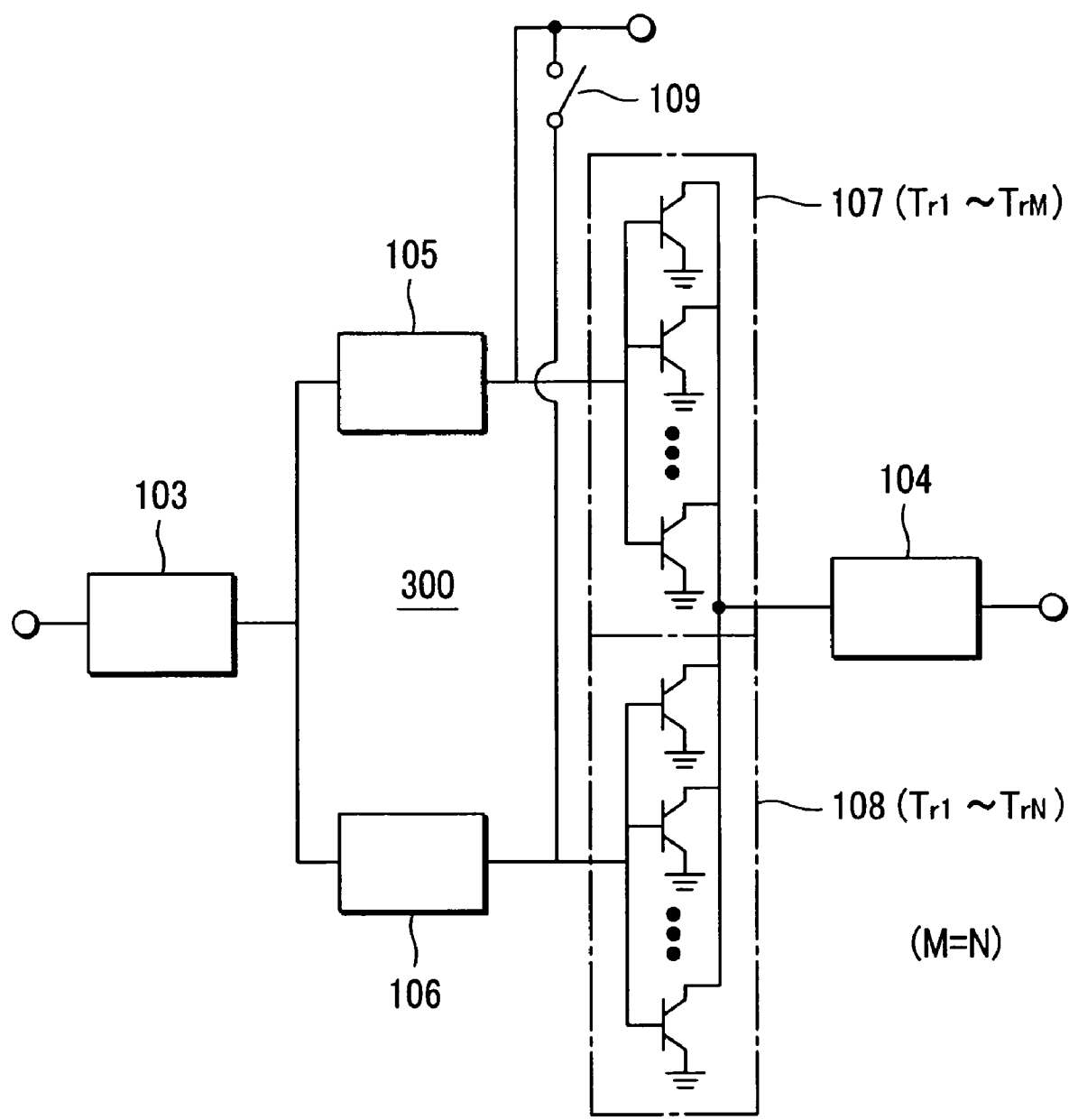
FIG. 5A is a block diagram showing an example of a structure for an amplifying stage in a case where a percentage of amplifier elements (amplifier elements are turned on) operable so as to perform amplification at the time of low output operation in the high-frequency power amplifier of the present invention is 50%.

Incidentally, in the high-frequency power amplifier, as shown in FIG. 5A, the output of the first amplifier 107 and the output of the second amplifier 108 are equal, and a percentage of the amplifier elements capable of performing amplification at the time of low-output operation (amplifying elements are in on-conditions) shall be 50%. In other words, the high-frequency power amplifier is comprised of the first amplifier 107 in which M pieces of unit cells are connected in parallel and which is always operated, and the second amplifier 108 in which N pieces of unit cells are connected in parallel and which is operated only at the time of high-output operation (M=N).

Figure 5B:
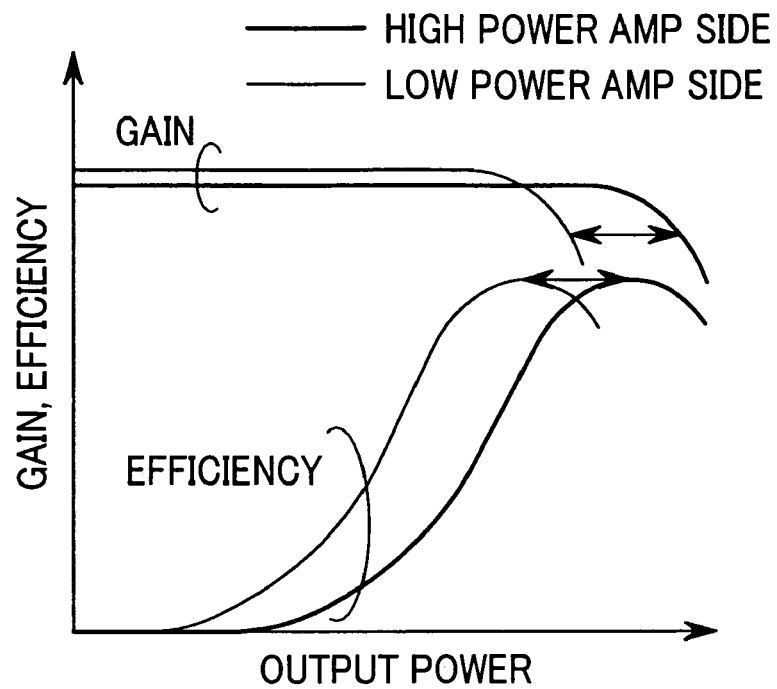
FIG. 5B is a view showing output power versus gain property and power addition efficiency in a case where a percentage of amplifier elements (amplifier elements are turned on) operable so as to perform amplification at the time of low output operation in the high-frequency power amplifier of the present invention is 50%.

In this case, the high-frequency power amplifier has such characteristics of patterns as shown in FIG. 5B, in which a gain difference between at the time of high-output operation and at the time of low-output operation is small. Therefore, a gain difference at the time of switching high-output operation and low-output operation is small. On the other hand, regarding efficiency, the efficiency of a low-output operation pattern is higher than that of a high-output operation pattern in a low-output region and this relation is reverse in a high-output region. Therefore, it is found that the application of the present invention can vary a peak point of efficiency at the time of low-output amplification, while restraining the gain difference.

Referring to FIG. 6, differences between the operation and effects of the present invention and those of the conventional example will be discussed hereinafter. FIG. 6A is a view showing an equalizing circuit of the example of the present invention which is shown in FIG. 1, in which (a) shows the equalizing circuit at the time of small output when only the first amplifier element is operated and (b) shows the equalizing circuit at the time of large output when the first and second amplifier elements are operated. Moreover, FIG. 6B is a view showing an equalizing circuit of the prior art disclosed in the document "School of Engineering Information and Communications University (ICU)", in which (a) shows the equalizing circuit at the time of small output when only the first amplifier element is operated and (b) shows the equalizing circuit at the time of large output when the first and second amplifier elements are operated.

Figure 6A:
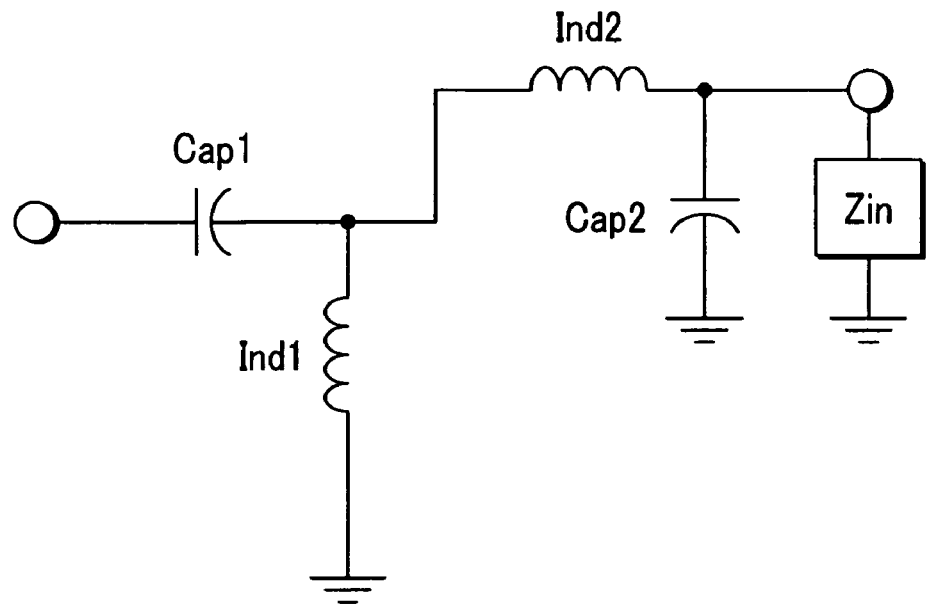
FIG. 6A is a circuit diagram showing an equalizing circuit of an example of the present invention.
Figure 6A:
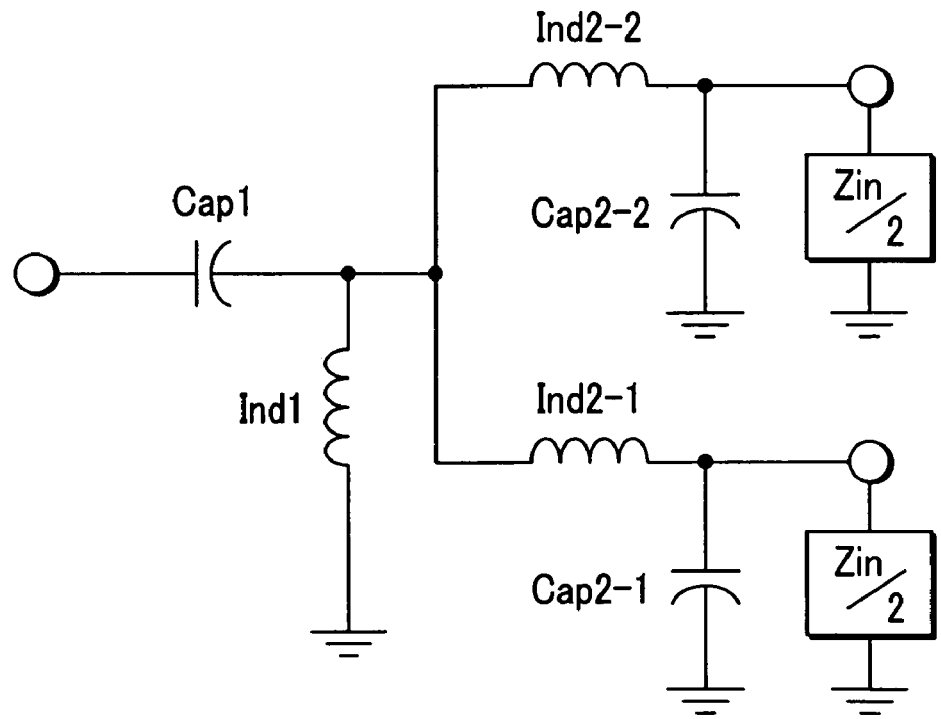
Figure 6C:
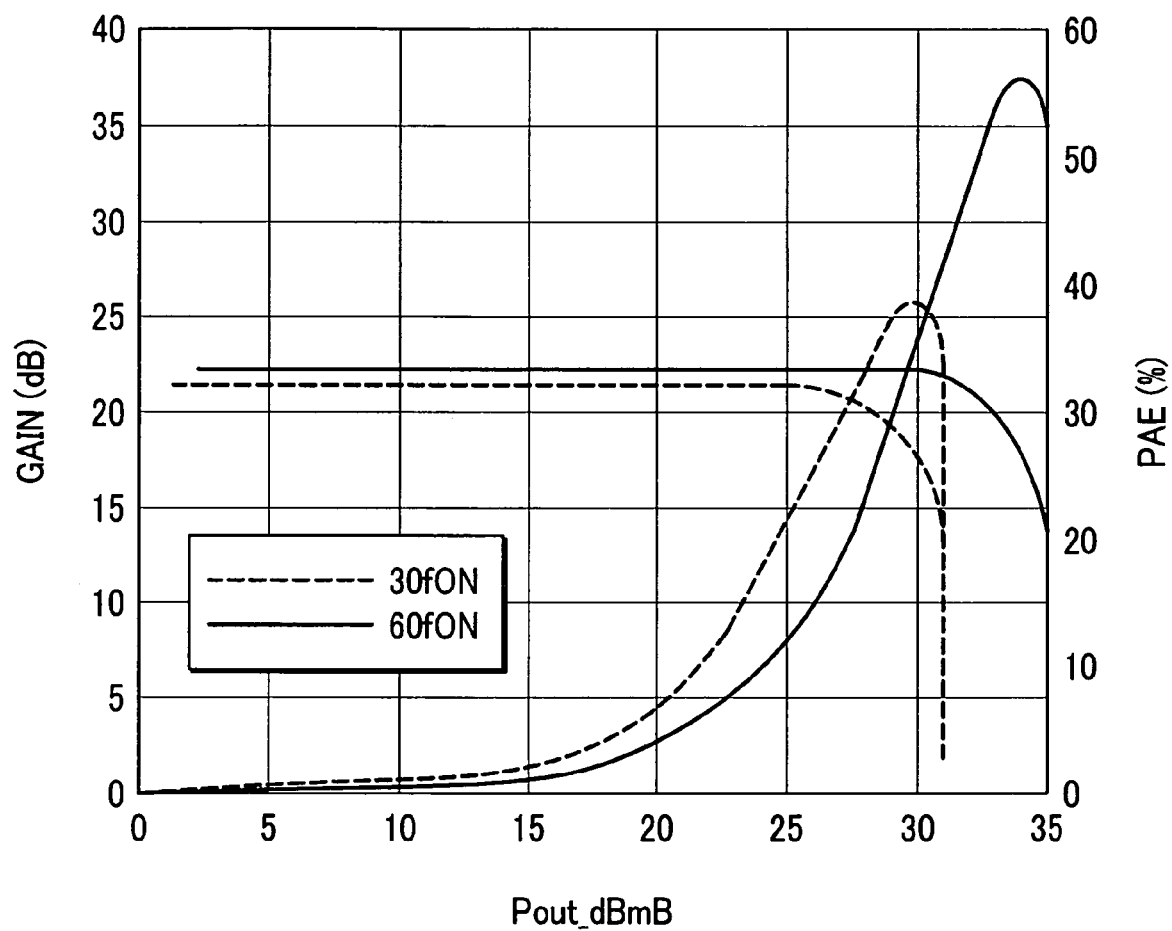
FIG. 6C is a graph showing characteristics of the embodiment of the present invention corresponding to the circuit of FIG. 6A.
Figure 6D:
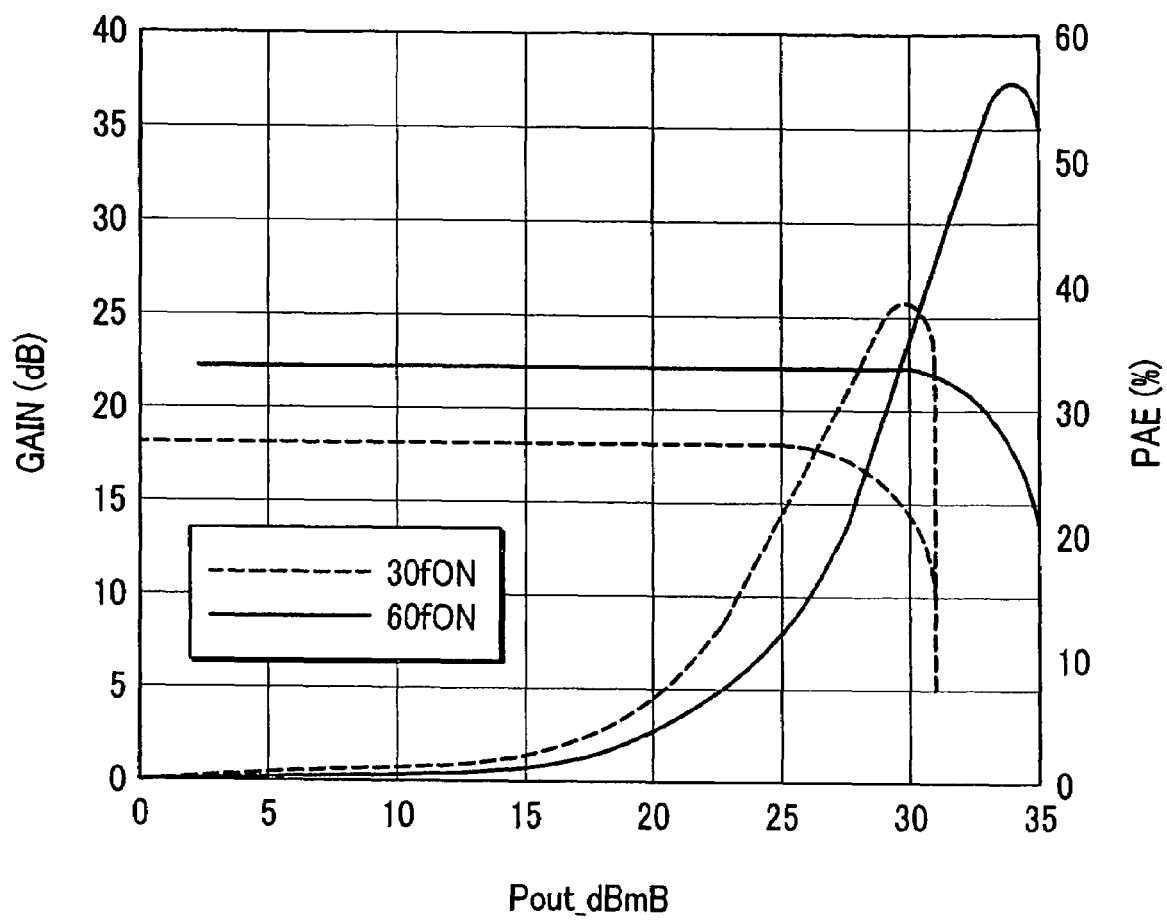
FIG. 6D is a graph showing characteristics of the conventional example corresponding to the circuit of FIG. 6B.

In the prior art, as shown in FIG. 6B, the input equalizing circuit both at the time of large output operation and at the time of small output operation is a three-dimensional matching circuit which is comprised of a series CAP 1, a shunt IND 1, and a series CAP 2. Therefore, matching is carried out to a limited range and the gain difference at the time of switching the large output operation and the small output operation is forced to be become increased, as shown in FIG. 6D.

To the contrary, in the present invention, at the time of both large output operation and small output operation, the input equalizing circuit is a four-dimensional matching circuit which is comprised of a series CAP 1, a shunt IND 1, a series IND 2 for adjusting gains (IND2-1 or IND2-2), shunt CAP 2 (CAP2-1 or CAP 2-2). The circuit includes the series IND 2 for adjusting gains, so that the matching is over a wide range, it is possible to considerably reduce the gain difference at the time of switching the large output operation and the small output operation, as shown in FIG. 6C.

Figure 7:
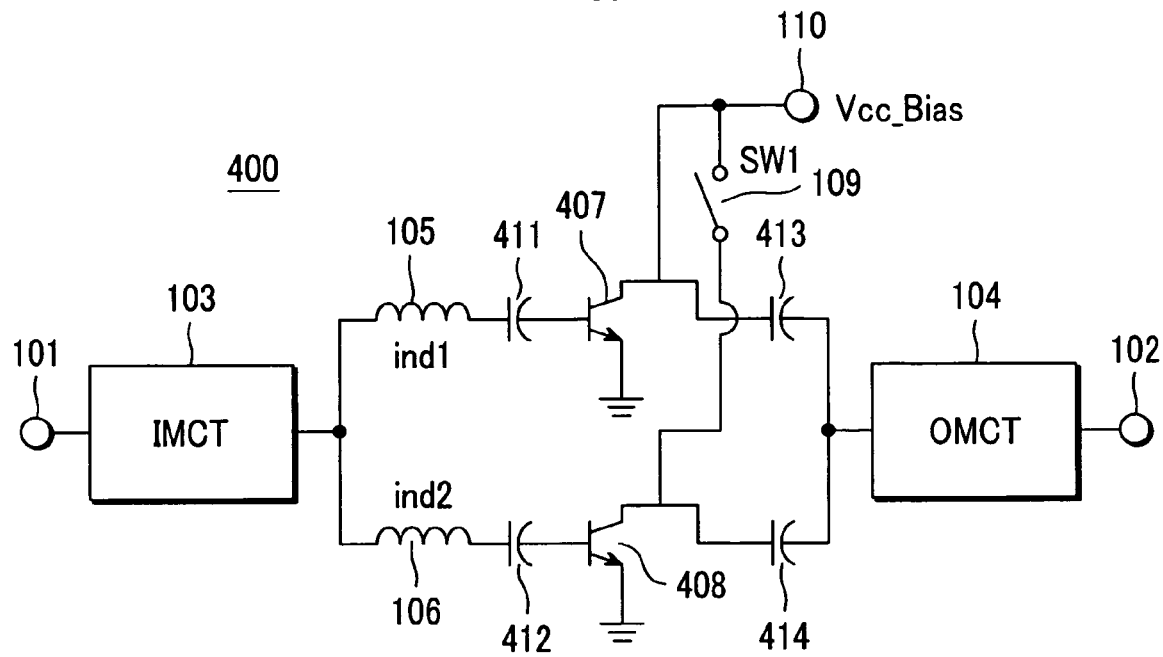
FIG. 7 is a block diagram showing still another embodiment of the high-frequency amplifier of the present invention.

Referring to FIG. 7, there is illustrated still another embodiment of the high-frequency power amplifier according to the present invention. The high-frequency power amplifier 400 according to this embodiment is designed such that the first amplifier 107 and second amplifier 108 of FIG. 1 are comprised of one stage bipolar transistors 407, 408. Base biases of the bipolar transistors 407, 408 are cut by capacitances 411, 412. Collector biases of the bipolar transistors 407, 408 are cut by capacitances 413, 414. Also, when the switching of the large output operation and small output operation is made to the large output operation, a switch 409 is turned on, whereby the bipolar transistors 407, 408 are operated; and when the switching is made to the small output operation, the switch 409 is turned off, whereby the collector biases are not applied and the bipolar transistor 408 is brought to a non-operation condition. Other structures, operations and effects are similar to those of the example shown in FIG. 1.

Figure 8:
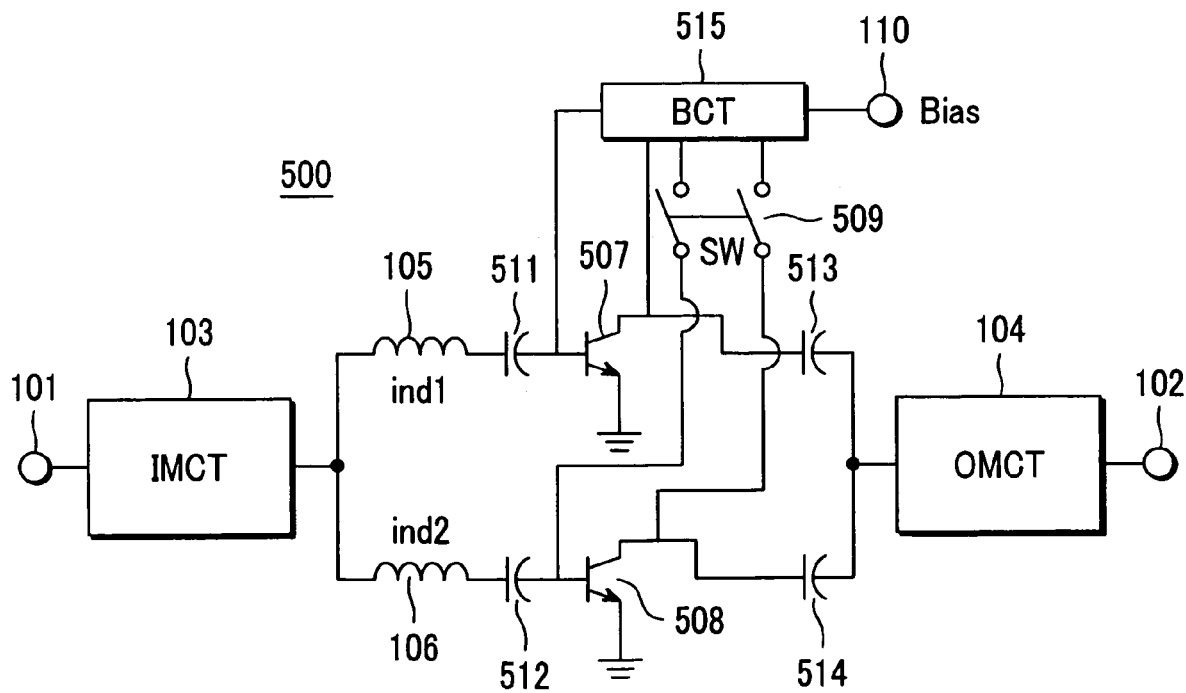
FIG. 8 is a block diagram showing yet another embodiment of the high-frequency amplifier of the present invention.

Referring to FIG. 8, there is illustrated still another embodiment of the high-frequency power amplifier according to the present invention. The high-frequency power amplifier 500 of this embodiment is designed such that the first amplifier 107 and the second amplifier 108 of FIG. 1 are comprised of one stage bipolar transistors 507, 508 and a bias cut circuit 515 is provided. Base biases of the bipolar transistors 507, 508 are cut by first and second input capacitances 511, 512. Also, collector biases of the bipolar transistors 507, 508 are cut by first and second output capacitances 513, 514 which constitute a part of the bias cut circuit 515. When the switchover from the small output operation to the large output operation is performed, a switch 509 which serves both as a part of the output control unit and a part of the bias cut circuit 515 of the bias control unit is turned off, whereby the bipolar transistors 507, 508 are operated. At the time of small output operation, the switch 509 is turned off, so that the base bias and collector bias are not applied and the bipolar transistor 508 is brought to a non-operation condition.

In this way, the output control unit and the bias control unit are constructed together as a control unit, so that it is possible to perform a high level control. Other construction, operation and effect of this embodiment are similar to those of the embodiment shown in FIG. 1.

Also, in the respective embodiments of the high-frequency power amplifier which are discussed above, the output powers of the respective power amplifiers may all be the same, or may be different from one another. That is, as yet another embodiment of the present invention, a percentage of the amplifier elements capable of amplifying at the time of the small output operation in the amplifier unit of the high-frequency power amplifier may be varied.

Figure 9:
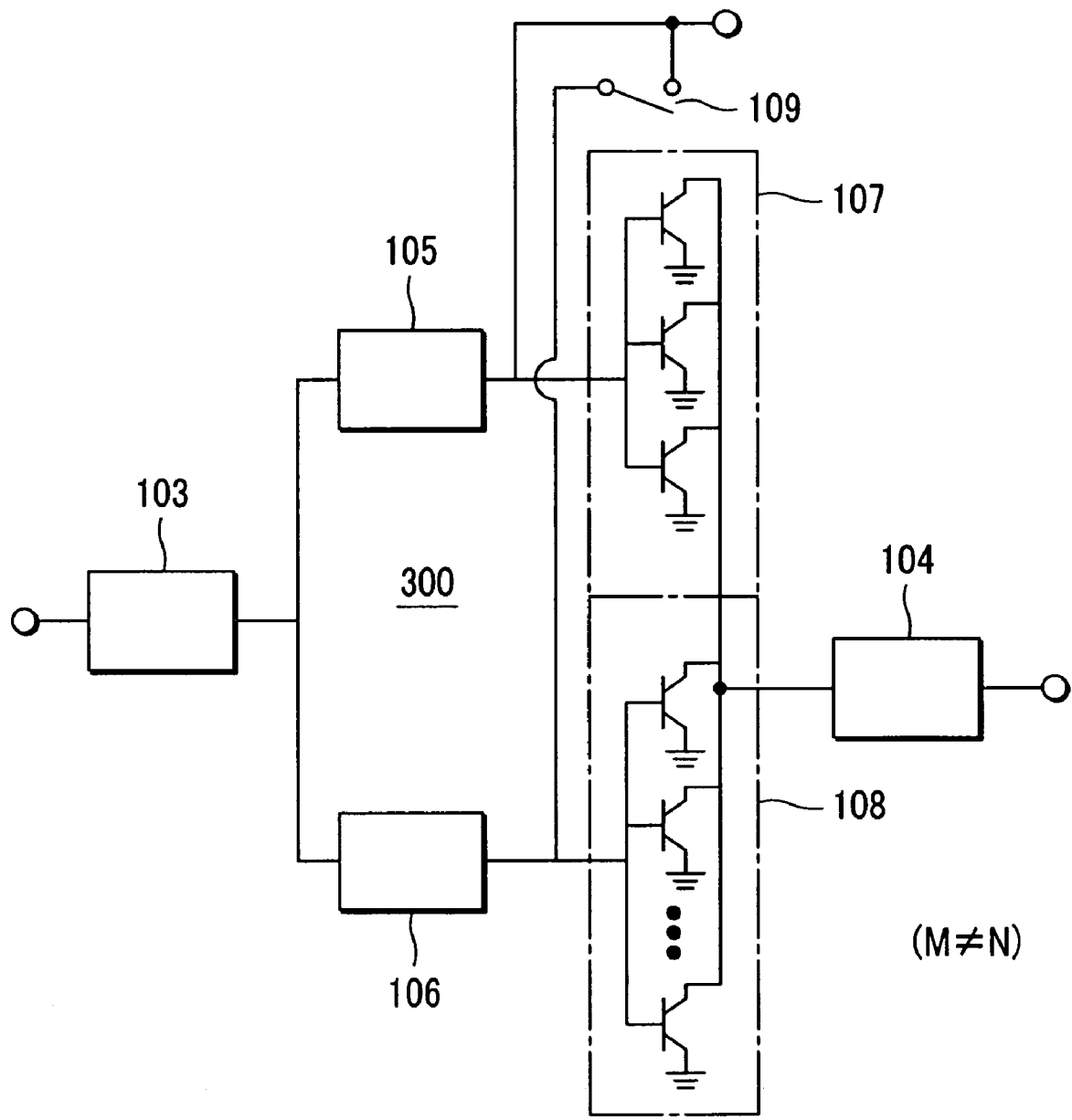
FIG. 9 is a block diagram showing an example of a structure for an amplifying stage in a case where a percentage of amplifier elements (amplifier elements are turned on) operable so as to perform amplification at the time of low output operation in the high-frequency power amplifier of the present invention is 50%.

In an embodiment shown in FIG. 9, the output of the first amplifier and the output of the second amplifier of the high-frequency power amplifier 300 are different. In other words, the high-frequency power amplifier is comprised of the first amplifier 107 in which M-pieces of unit cells are connected in parallel and which is always operated, and the second amplifier 108 in which N-pieces of unit cells are connected in parallel and which is operated only at the time of the large output operation (M≠N).

Figure 10:
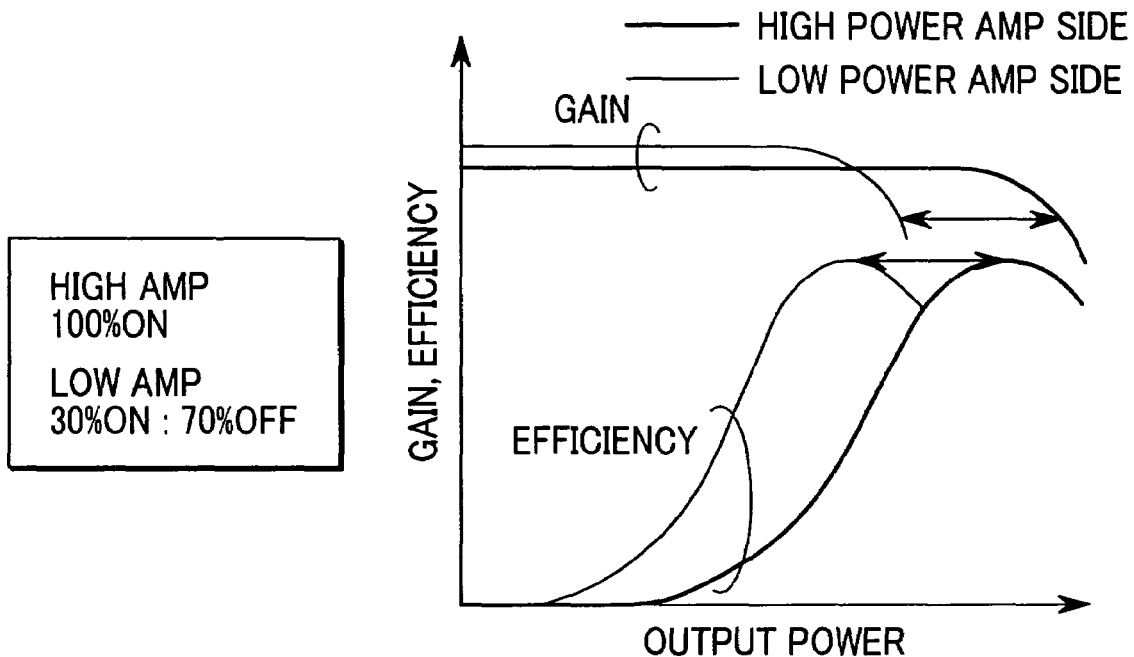
FIG. 10 is a view showing output power versus gain property and power addition efficiency in a case where a percentage of amplifier elements (amplifier elements are turned on) operable so as to perform amplification at the time of low output operation in the high-frequency power amplifier of the present invention is 30%.

As an example, when a percentage of the first amplifiers capable of performing amplification at the time of the small output operation (amplifying elements are always in On-conditions) is 30%, the high-frequency power amplifier has characteristics of patterns shown in FIG. 10 in which gain difference between at the time of the large output operation and at the time of the small output operation is small. On the other hand, regarding efficiency, the efficiency of the 5 pattern of the small output operation is larger than that of the pattern of the large output operation at the small output region, and this relationship is reverse at the large output region. Therefore, the application of the present invention can allow a high efficiency to be obtained even at the time of the small output amplifying, while restricting the gain difference.

Figure 11:
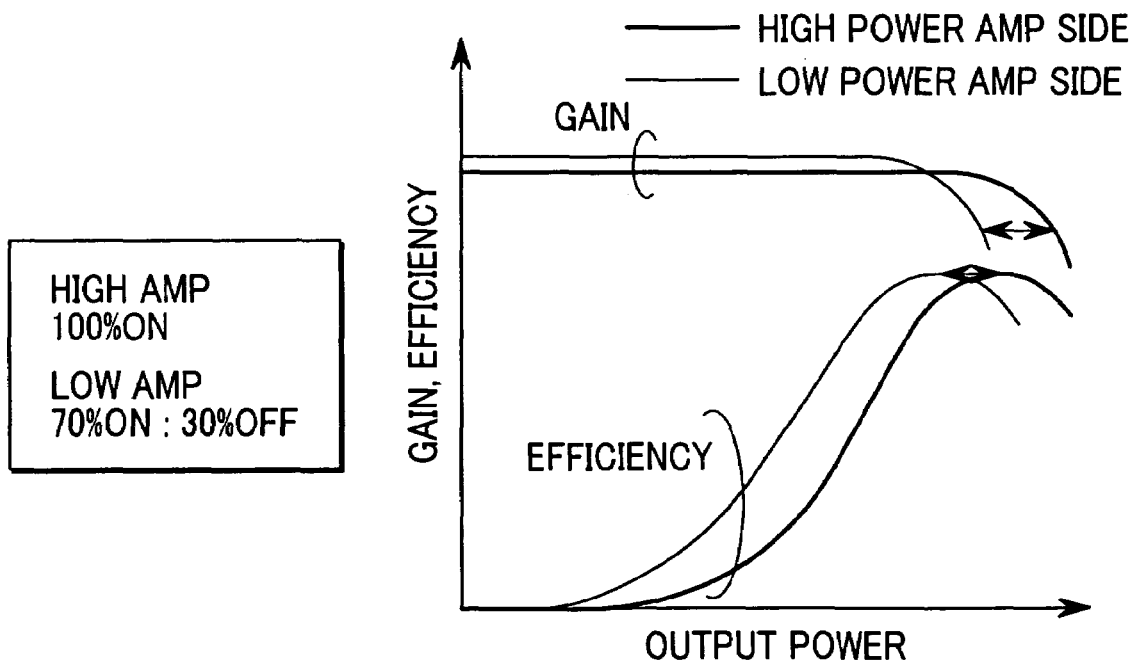
FIG. 11 is a view showing output power versus gain property and power addition efficiency in a case where a percentage of amplifier elements (amplifier elements are turned on) operable so as to perform amplification at the time of low output operation in the high-frequency power amplifier of the present invention is 70%.

Conversely, when a percentage of the first amplifiers capable of performing amplification at the time of the small output operation (amplifying elements are always in On-conditions) is 70%, the high-frequency power amplifier has characteristics of patterns shown in FIG. 11 in which the gain difference between at the time of the large output operation and at the time of the small output operation is small. On the other hand, regarding efficiency, the efficiency of the pattern of the small output operation is larger than that of the pattern of the large output operation at the small output region, and this relationship is reverse at the large output region. Therefore, the application of the present invention can allow a stable and highly efficient large-output to be obtained while constraining the gain difference and can allow a relatively high efficiency to be obtained even at the time of the small output amplifying.

Thus, according to the present invention, in the amplifier in which the amplifiers are all operated at the time of the large output and a part of the amplifiers is stopped at the time of the small output operation, the inductances are inserted in series between the signal input units and the input matching circuits of the respective amplifiers, whereby it is possible to obtain the effect of minimizing the gain difference between at the time of the large output operation and at the time of the small output operation. Also, when a percentage of the amplifier elements capable of performing amplification at the small output operation (amplifier elements are in On-conditions) is varied in the amplifier unit in the high-frequency power amplifier, it is possible to vary the peak point of the efficiency at the time of the low-output, so that the present invention can be applied to high-frequency amplifiers of various types. According to the present invention, it is possible to vary the peak point of the efficiency at the time of the small output amplifying, while restraining the gain difference. Moreover, when the present invention is applied to the transmission unit of the radio telecommunication equipment, it is possible to reduce an amplification variable range of the AGC amplifier arranged at a front stage of the high-frequency power amplifier unit and obtain the effect of miniaturizing of the entire transmission unit.

Incidentally, it should go without saying that in the high-frequency power amplifier according to the present invention, as the amplifying elements constituting an amplification stage, elements other than the bipolar transistors used in the embodiments, for example, FETs may be used.

Also, in the high-frequency power amplifier according to the present invention, the inductance element for adjusting gains which is inserted in series in the input signal line may be comprised of various members having inductance characteristics.

Figure 12:
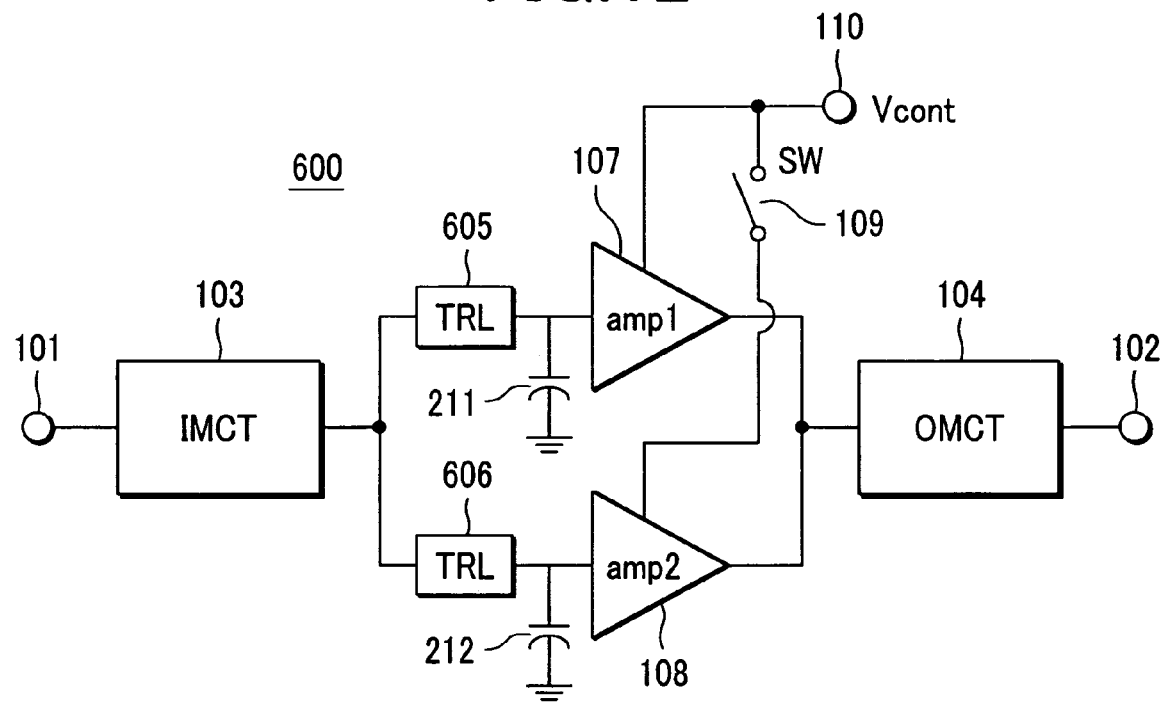
FIG. 12 is a block diagram showing still another embodiment of the high-frequency power amplifier of the present invention.

Referring to FIG. 12, there is illustrated yet another embodiment of the high-frequency power amplifier according to the present invention. The high-frequency power amplifier 600 is designed such that a first input inductance 105 and a second input inductance 106 for adjusting gains of FIG. 2 are constructed by a first distribution constant line 605 and a second distribution constant line 606. Other structures, operations and effects of this embodiment are similar to those of the embodiment shown in FIG. 2.

Figure 13:
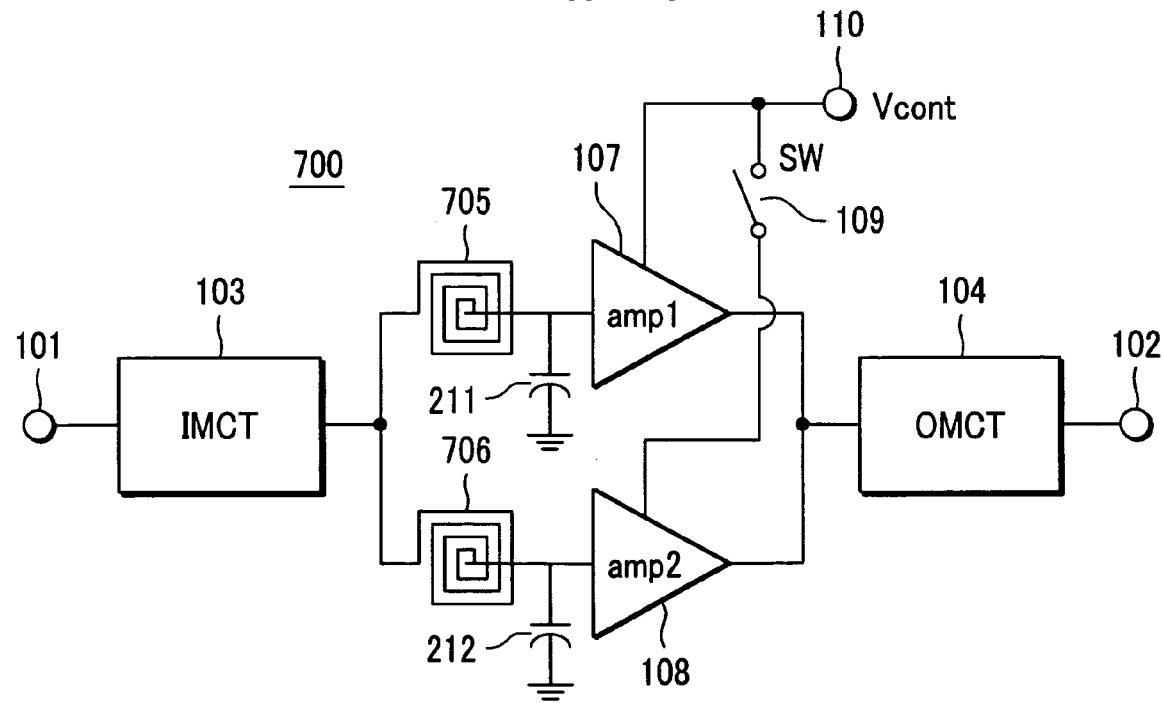
FIG. 13 a block diagram showing yet another embodiment of the high-frequency power amplifier of the present invention.

Referring to FIG. 13, there is illustrated still another embodiment of the high-frequency power amplifier according to the present invention. The high-frequency power amplifier 700 is designed such that the first input inductance 105 and the second input inductance 106 of FIG. 2 are constructed by first and second spiral inductors 705, 706. Other structures, operations and effects of this embodiment are similar to those of the embodiment shown in FIG. 2.

Figure 14:
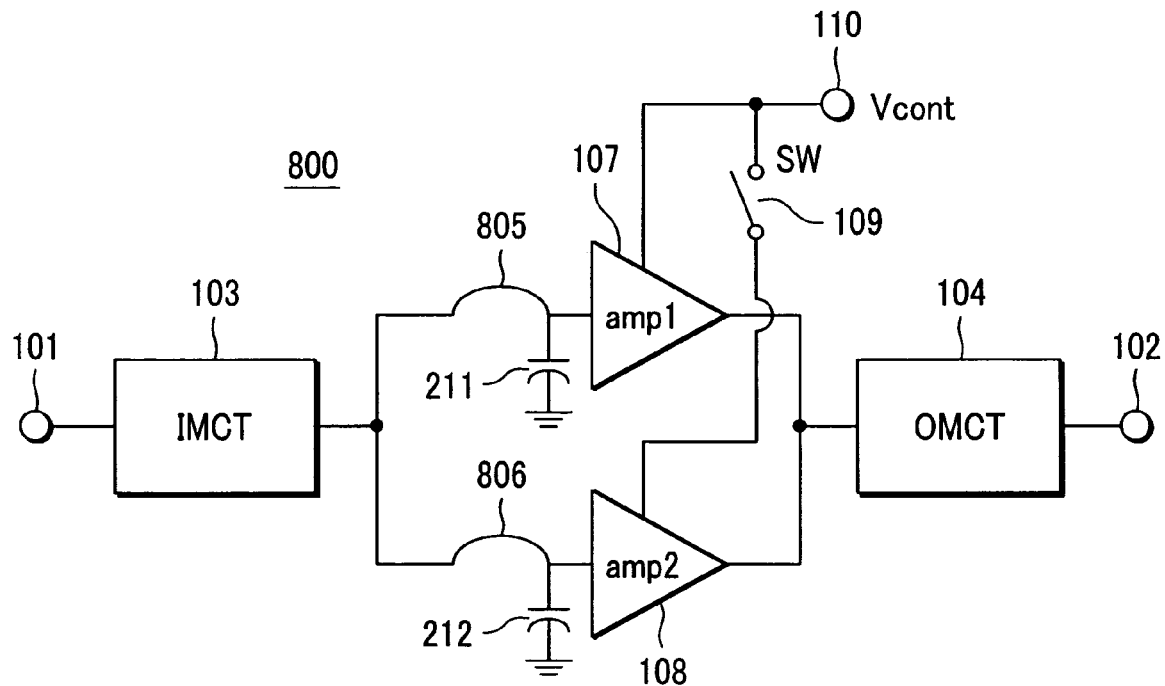
FIG. 14 a block diagram showing still another embodiment of the high-frequency power amplifier of the present invention.

Referring to FIG. 14, there is illustrated yet another embodiment of the high-frequency power amplifier according to the present invention. The high-frequency power amplifier is designed such that the first input inductance 105 and the second input inductance 106 of FIG. 2 are constructed by a first bonding wire 805 and a second bonding wire 806. Other structures, operations and effects of this embodiment are similar to those of the embodiment shown in FIG. 2.

Figure 15:
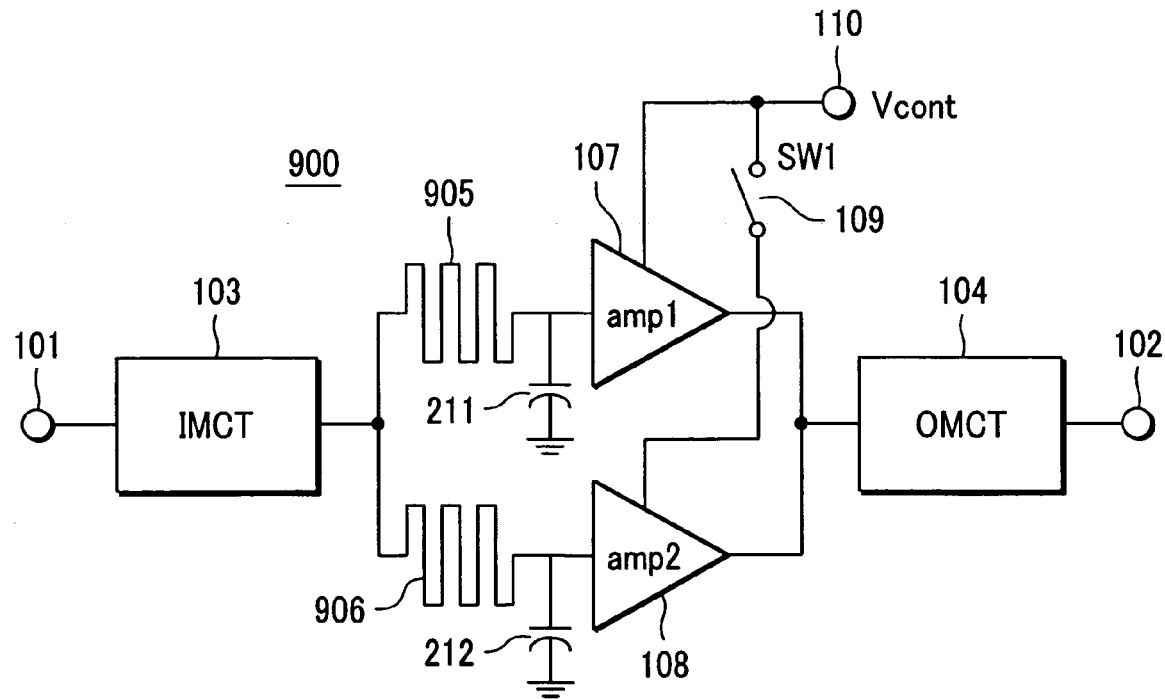
FIG. 15 a block diagram showing yet another embodiment of the high-frequency power amplifier of the present invention.

Referring to FIG. 15, there is illustrated still another embodiment of the high-frequency power amplifier according to the present invention. The high-frequency power amplifier is designed such that the first input inductance 105 and the second input inductance 106 of FIG. 2 are constructed by a first meander-shaped inductor 905 and a second meander-shaped inductor 906. Other structures, operations and effects of this embodiment are similar to those of the embodiment shown in FIG. 2.

It should go without saying that in high-frequency power amplifiers of the respective embodiments according to the present invention, the first amplifier and the second amplifier may be constructed as multistage amplifiers.

Figure 16:
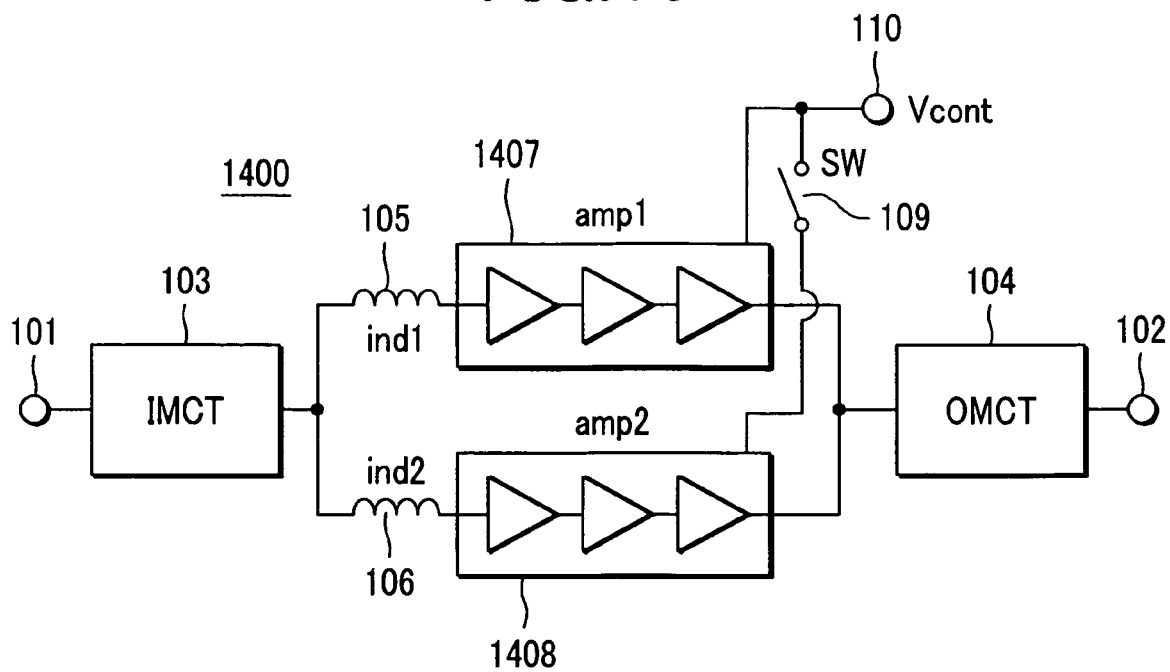
FIG. 16 is a block diagram showing still another embodiment of the high-frequency power amplifier of the present invention.

As one example, yet another embodiment of the high-frequency power amplifier according to the present invention is shown in FIG. 16. The high-frequency power amplifier 1400 is designed such that the first amplifier 107 and the second amplifier 108 of FIG. 1 are constructed by a first multistage amplifier 1407 and a second multistage amplifier 1408. Other structures, operations and effects of this embodiment are similar to those of the embodiment shown in FIG. 1.

In the high-frequency power amplifiers of the respective embodiments according to the present invention, the input matching circuits may be constructed by multistage matching circuits.

Figure 17:
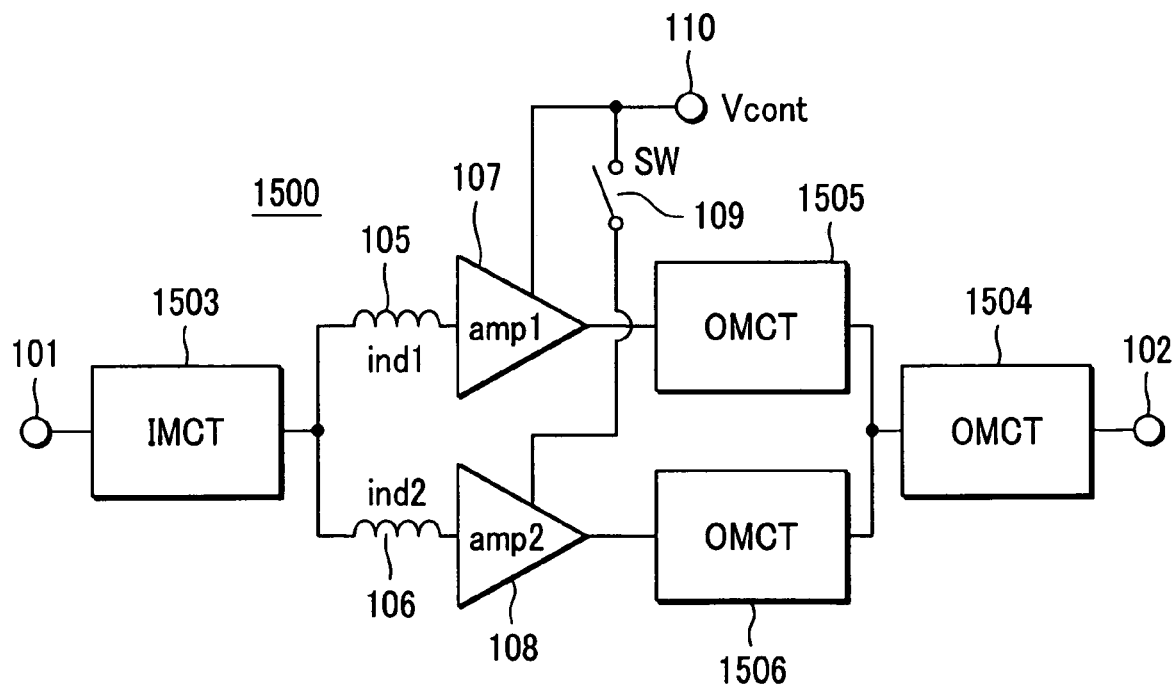
FIG. 17 is a block diagram showing yet another embodiment of the high-frequency power amplifier of the present invention.

As one example, still another embodiment of the high-frequency power amplifier according to the present invention is shown in FIG. 17. The high-frequency power amplifier 1500 comprises an input matching circuit 1503, inductance elements 105, 106 for adjusting gains inserted in series in the input signal lines of the respective power amplifiers, a first amplifier 107 and a second amplifier 108 arranged in parallel, a third input matching circuit 1505 and a fourth matching circuit 1506 for matching outputs of the respective power amplifiers, a second output matching circuit 1504 for performing output matching after the outputs of the respective power amplifier output matching circuits 1505, 1506 are connected in series, a switch 109 for causing the second amplifier 108 to be brought to a non-operation condition, and a control unit (not shown) for controlling the switch 109. Other structures, operations and effects of this embodiment are similar to those of the embodiment shown in FIG. 1.

The high-frequency power amplifier may be constructed such that three or more amplifiers are arranged in parallel.

Figure 18:
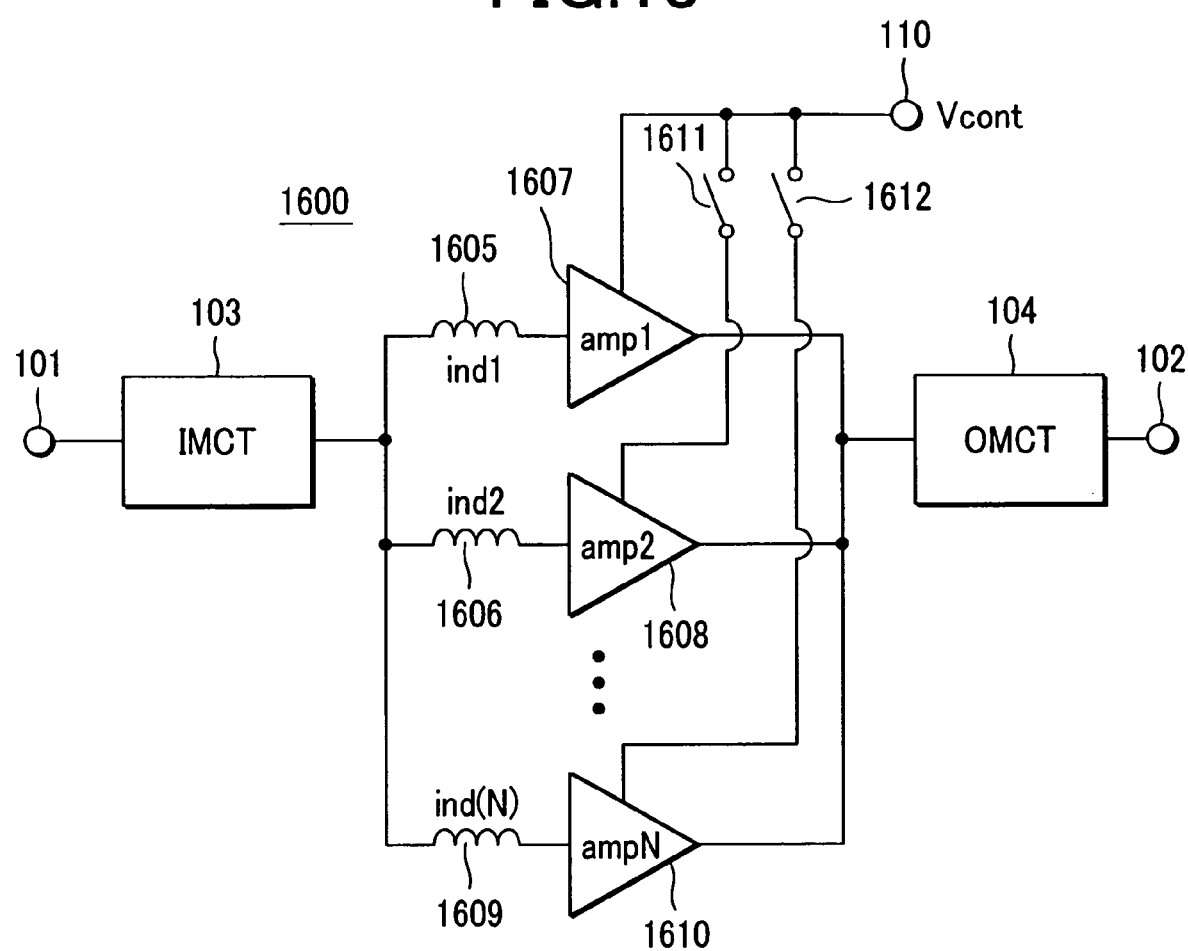
FIG. 18 is a block diagram showing yet another embodiment of the high-frequency power amplifier of the present invention.

Referring to FIG. 18, there is illustrated yet another embodiment of the high-frequency power amplifier according to the present invention. The high-frequency power amplifier 1600 comprises an input matching circuit 103, inductance elements 1605, 1606, 1609 inserted in series in input signal lines of the respective power amplifiers for adjusting gains, and a first amplifier 1607, a second amplifier 1608, and a third amplifier 1610 arranged in parallel. Also, switches 1611, 1612 for causing the second amplifier 1608 and the third amplifier 1610 of the second multistage amplifier 108 to be brought to non-operation conditions, and a control unit (not shown) for controlling the switches 1611, 1612 are provided. Other structures, operations and effects of this embodiment are similar to those of the embodiment shown in FIG. 1.

In the high-frequency power amplifier 1600, for example, a percentage of the first amplifier 1607 being an amplifier element capable of performing amplification (amplifier element is in an ON-condition) at the time of the small output operation shall be 40%, the outputs of the second amplifier 1608 and the third amplifier 1610 shall be equal, and percentages thereof shall be 30%. The control unit, in addition to the first amplifier 1607, controls the second amplifier 1608 so that it is operated at the time of medium output operation, and controls the third amplifier 1610 so that it is operated at the time of large output operation.

Figure 19:
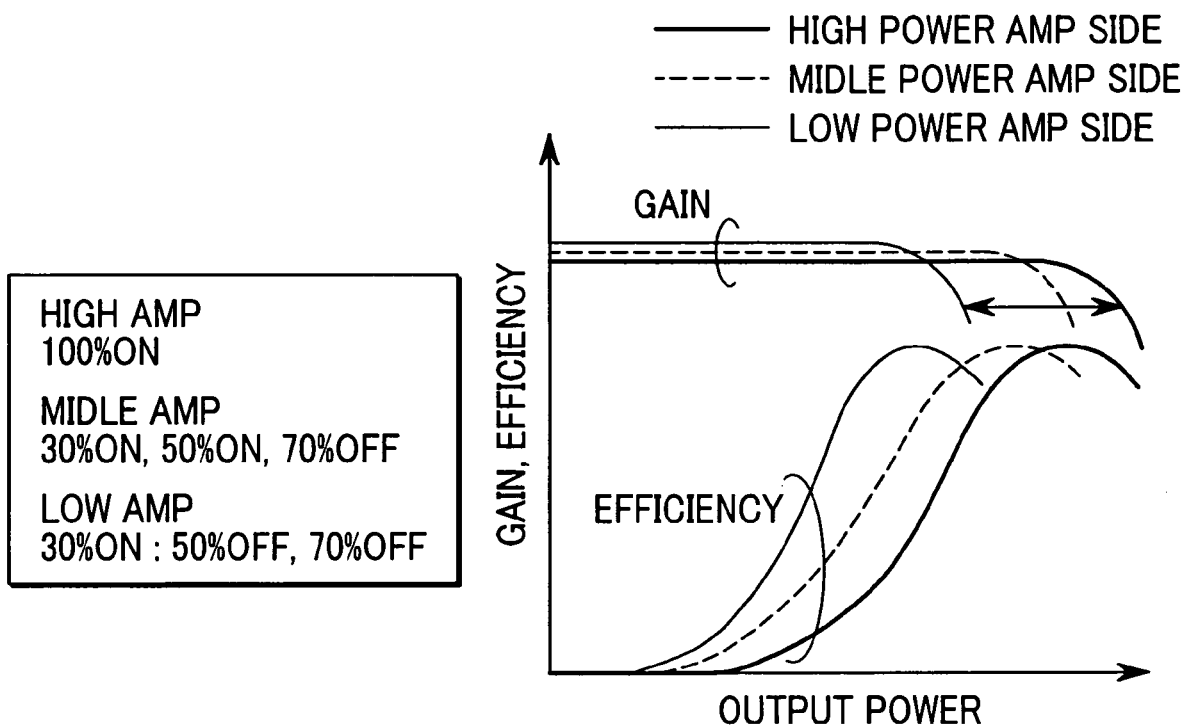
FIG. 19 is a view showing output power versus gain property and power addition efficiency in a case where a percentage of amplifier elements (amplifier elements are turned on) operable so as to carry out amplification at the time of low output operation in an amplifier unit of FIG. 18 is changed.

In this case, the high-frequency power amplifier has characteristics of a pattern shown in FIG. 19. It is found that it is possible to vary a peak point of efficiency at the time of the large output amplifying and the time of the medium output amplifying, while restricting gain difference.

Figure 20:
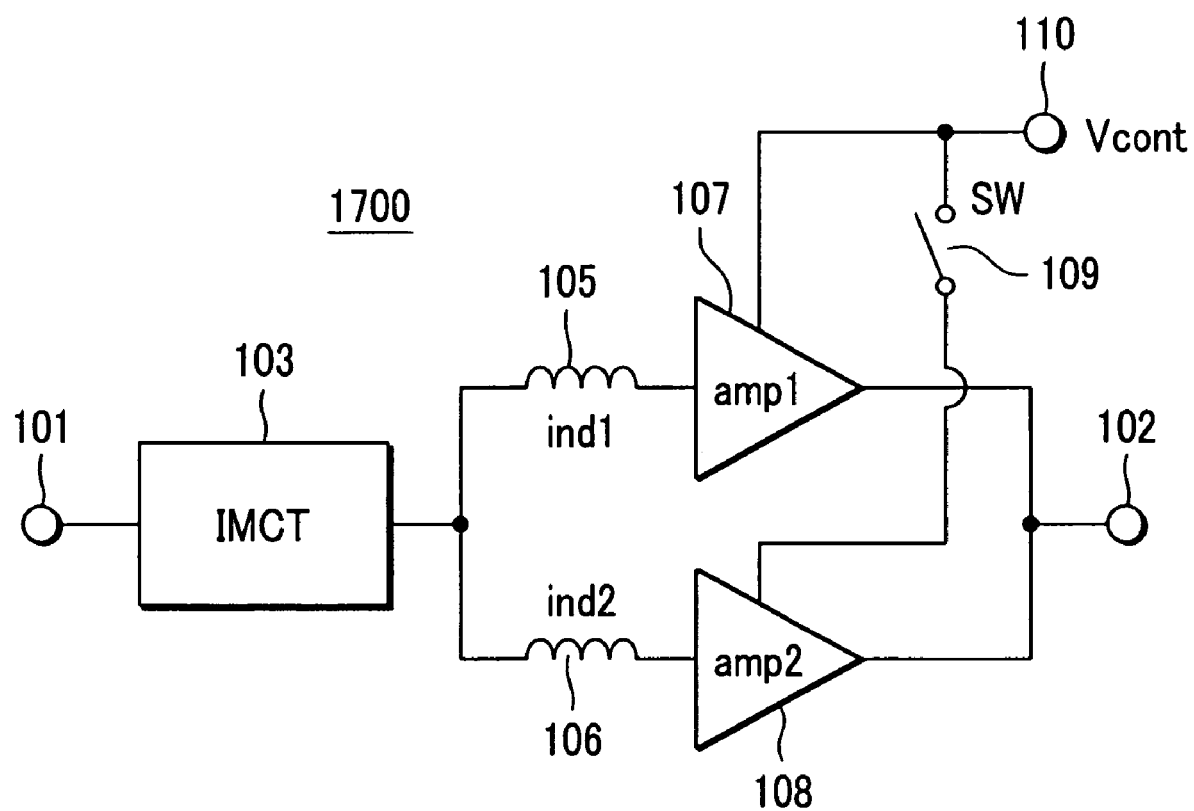
FIG. 20 is a block diagram showing still another embodiment of the high-frequency power amplifier according to the present invention.

In the high-frequency power amplifier, in a case where it is unnecessary to match the output, the output matching circuit at the output side may be omitted. Referring to FIG. 20, there is illustrated still another embodiment of the high-frequency power amplifier according to the present invention. The high-frequency power amplifier 1700 is constructed such that the output matching circuit 104 of FIG. 1 is omitted. The output sides of the respective power amplifiers 107, 108 are connected directly to the output terminal 102 after they are connected in parallel. Other construction, operation and effect of this embodiment are similar to those of the embodiment shown in FIG. 1.

Moreover, it goes without saying that the present invention can be applied to high-frequency power amplifiers using data transmission technologies, such as other systems including a GSM system, a TDMA system and the like.

The terms and expressions which have been employed herein are used as terms of description, not of limitation. There is no intention in the use of such terms and expressions of excluding any equivalents of the features shown and described or portions thereof. However, it is recognized that various modifications are possible within the scope of the invention claimed.

What is claimed is:

1. A high-frequency power amplifier comprising:
    a plurality of power amplifiers arranged in parallel;
    an inductance element inserted in series in an input signal line of said each power amplifier;
    an input matching circuit for performing matching of inputs of a parallel connection which connect each series connection of said power amplifier and said inductance element in parallel;
    an output matching circuit for performing matching of outputs of the parallel connection; and
    a control unit for controlling said power amplifiers in such a manner that one of said power amplifiers is always brought to an operation condition and the remainder of said power amplifiers are brought to an operation or non-operation conditions,
    wherein said input matching circuit is coupled to each of said power amplifiers through a switchless coupling.

2. The high-frequency power amplifier according to claim 1, wherein said control unit includes a switch for switching said remainder of said power amplifiers to the operation condition or non-operation condition.

3. The high-frequency power amplifier according to claim 1, wherein said output matching circuit includes a first output matching circuit for performing matching of outputs of said respective power amplifiers, and a second output matching circuit for performing matching of an output of a parallel connection which connected each of said output of the first output matching circuits in parallel.

4. The high-frequency power amplifier according to claim 1, wherein said respective power amplifiers are different in output power thereof.

5. The high-frequency power amplifier according to claim 1, further comprising a capacitor on the input signal line of each of said power amplifier, said capacitor being connected in parallel between said inductance element inserted in series in the input signal line of said power amplifier and an input terminal of said power amplifier, and between said inductance element and earth.

6. The high-frequency power amplifier according to claim 1, wherein the plurality of power amplifiers which are connected in parallel are multistage amplifiers which are cascade-connected in two stages or more.

7. The high-frequency power amplifier according to claim 1, wherein said inductance element comprises a microstrip line.

8. The high-frequency power amplifier according to claim 1, wherein said inductance element comprises a spiral structure.

9. The high-frequency power amplifier according to claim 1, wherein said inductance element comprises a bonding wire.

10. The high-frequency power amplifier according to claim 1, wherein said inductance element comprises a meander structure.

11. The high-frequency power amplifier according to claim 1, wherein an element which constitutes said power amplifier is a bipolar transistor.

12. The high-frequency power amplifier according to claim 1, wherein an element which constitute said power amplifier is a FET.

13. The high-frequency power amplifier according to claim 1, wherein said power amplifier is formed over a monolithic substrate.

14. A high-frequency power amplifier comprising:
    a plurality of power amplifiers arranged in parallel;
    an inductance element inserted in series in each of said input signal line of said power amplifier for adjusting gain;
    an input matching circuit for performing matching of inputs of a parallel connection which connect each series connection of said power amplifier and said inductance element in parallel;
    an output terminal connected in parallel with each of output of said power amplifiers; and
    a control signal terminal adapted to receive control signals for controlling said power amplifiers in such a manner that one of said power amplifiers is always brought to an operation condition and the remainder of said power amplifiers is brought to an operation or non-operation conditions,
    wherein said input matching circuit is coupled to each of said power amplifiers through a switchless coupling.

15. The high-frequency power amplifier according to claim 14, further comprising an output matching circuit for performing matching of outputs of the parallel connection.

16. The high-frequency power amplifier according to claim 14, further comprising a control unit for controlling said power amplifiers in such a manner that one of said power amplifiers is always brought to an operation condition and the remainder of said power amplifiers are brought to an operation or non-operation condition.

17. A radio communication equipment including a transmission unit comprising a high-frequency power amplifier and a control unit,
    said high-frequency power amplifier comprising:
    a plurality of power amplifiers arranged in parallel;
    an inductance element inserted in series in each of input signal line of said power amplifier for adjusting gain;
    an input matching circuit for performing matching of inputs of a parallel connection which connect each series connection of said power amplifier and said inductance element in parallel;
    an output matching circuit for performing matching of outputs of said parallel connection; and
    said control unit comprising a means for controlling said power amplifiers in such a manner that one of said power amplifiers is always brought to an operation condition and the remainder of said power amplifiers are brought to an operation or non-operation conditions,
    wherein said input matching circuit is coupled to each of said power amplifiers through a switchless coupling.

18. The radio communication equipment according to claim 17, wherein said transmission unit comprises a bias control unit for detecting output values of said high-frequency power amplifier and for controlling the output of said high-frequency power amplifier.

19. The radio communication equipment according to claim 17, wherein said transmission unit comprises a gain variable amplifier and said control unit has a gain controlling means for controlling said gain variable amplifier according to an output power value of said high-frequency power amplifier.

20. The radio communication equipment according to claim 17, wherein said control unit has a switching means for switching between a large-output amplifier and a small-output amplifier by a bias control.

* * * * *